United States Patent
Yamashita et al.

(10) Patent No.: US 8,493,294 B2
(45) Date of Patent: Jul. 23, 2013

(54) DISPLAY DEVICE AND ELECTRONIC APPARATUS

(75) Inventors: Junichi Yamashita, Tokyo (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 372 days.

(21) Appl. No.: 12/857,992

(22) Filed: Aug. 17, 2010

(65) Prior Publication Data

US 2011/0043502 A1 Feb. 24, 2011

(30) Foreign Application Priority Data

Aug. 24, 2009 (JP) ................................. 2009-192853

(51) Int. Cl.
*G09G 3/30* (2006.01)

(52) U.S. Cl.
USPC ........................... 345/76; 315/169.3; 313/500

(58) Field of Classification Search
USPC ........ 345/204–215, 76, 82; 315/169.1–169.4; 313/500
See application file for complete search history.

(56) References Cited

U.S. PATENT DOCUMENTS

| 4,862,286 | A * | 8/1989 | Suda et al. ..................... 358/494 |
| 6,337,542 | B1 * | 1/2002 | Hanaki et al. ............... 315/169.3 |
| 7,224,115 | B2 * | 5/2007 | Sato et al. ...................... 313/504 |
| 7,733,318 | B2 * | 6/2010 | Awakura et al. ................ 345/96 |
| 2005/0275616 | A1 * | 12/2005 | Park et al. ...................... 345/102 |
| 2006/0022934 | A1 * | 2/2006 | Whitted et al. ............... 345/102 |
| 2009/0102826 | A1 * | 4/2009 | Oke et al. ...................... 345/211 |
| 2010/0020051 | A1 * | 1/2010 | Kim et al. ..................... 345/207 |
| 2010/0103203 | A1 * | 4/2010 | Choi ............................. 345/690 |

FOREIGN PATENT DOCUMENTS

JP 2007-156044 6/2007

* cited by examiner

*Primary Examiner* — Kent Chang
*Assistant Examiner* — Gerald Oliver
(74) *Attorney, Agent, or Firm* — Dentons US LLP

(57) ABSTRACT

A display device includes: a dummy pixel provided on a display panel; a reflection film provided on a light-emitting-surface side of the display panel for reflecting light emitted from the dummy pixel; a photodetector provided on an opposite side of the display panel from the light-emitting surface for detecting the light emitted from the dummy pixel and reflected from the reflection film; and a correction circuit for correcting, based on the results of detection by the photodetector, the luminance of effective pixels that contribute to image display.

12 Claims, 15 Drawing Sheets

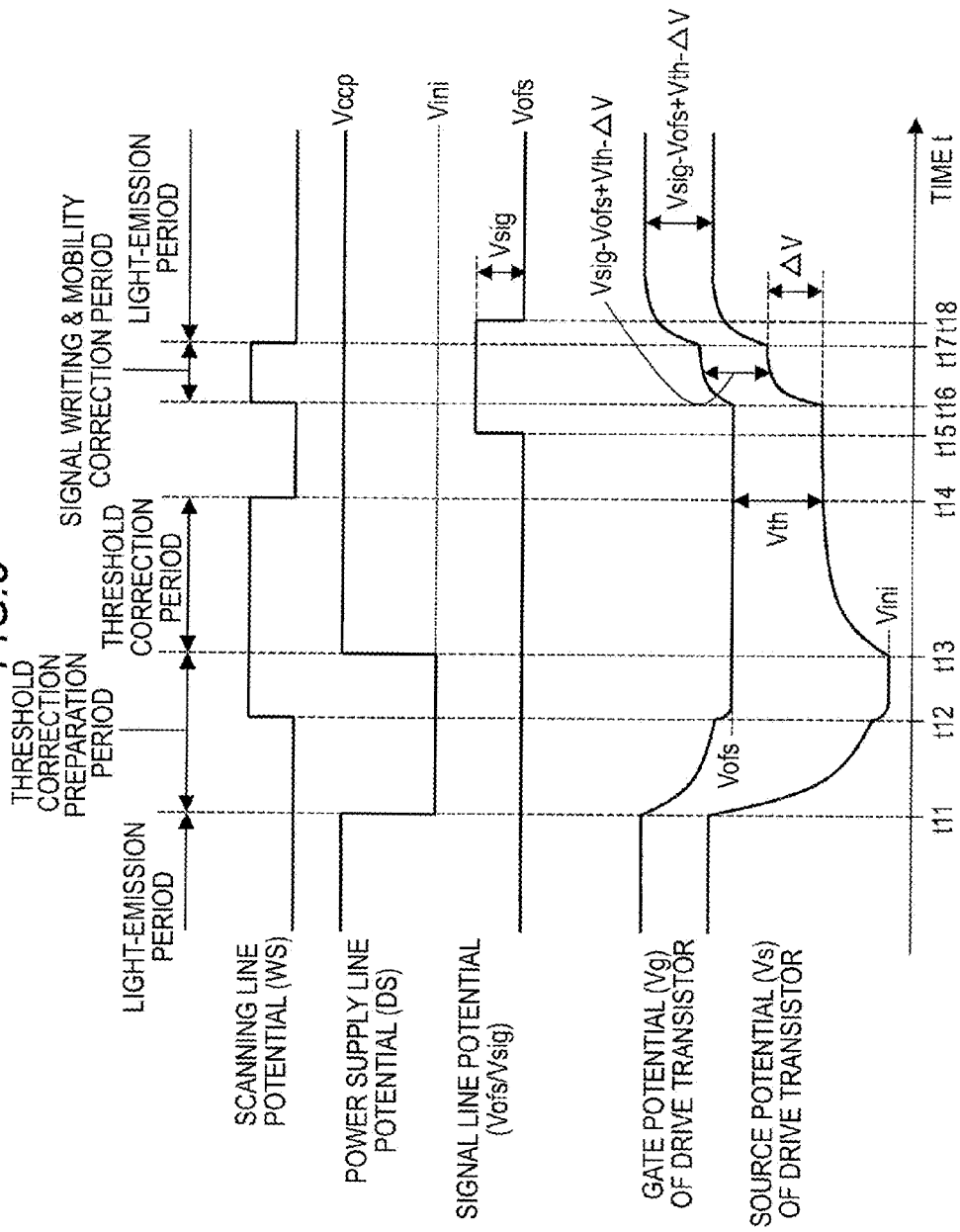

t = BEFORE t11 t=t11 t=t12 t=t13 t=t14 t=t15 t=t16 t=t17

THRESHOLD CORRECTION: NOT APPLIED
MOBILITY CORRECTION: NOT APPLIED

THRESHOLD CORRECTION: APPLIED
MOBILITY CORRECTION: NOT APPLIED

THRESHOLD CORRECTION: APPLIED
MOBILITY CORRECTION: APPLIED

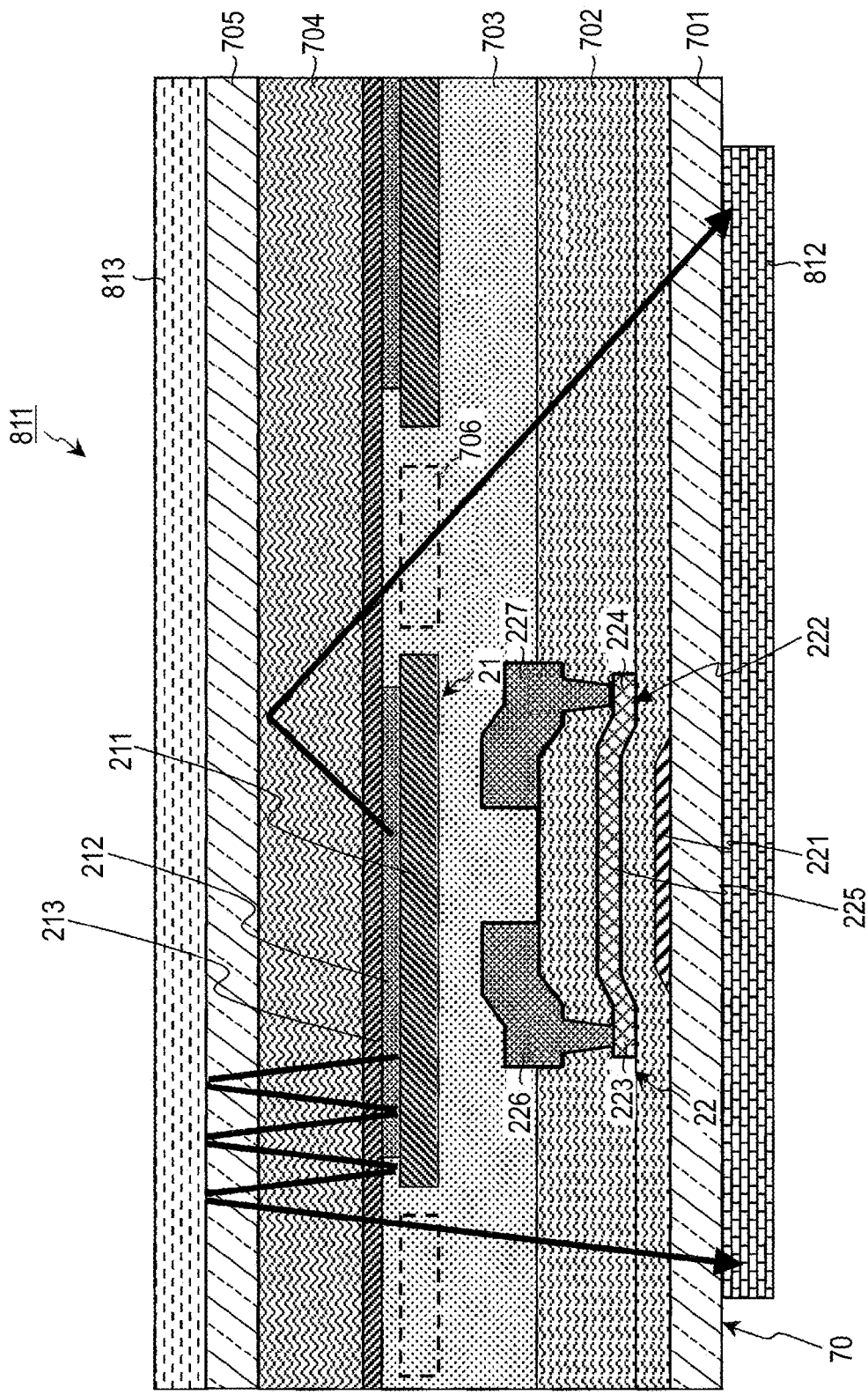

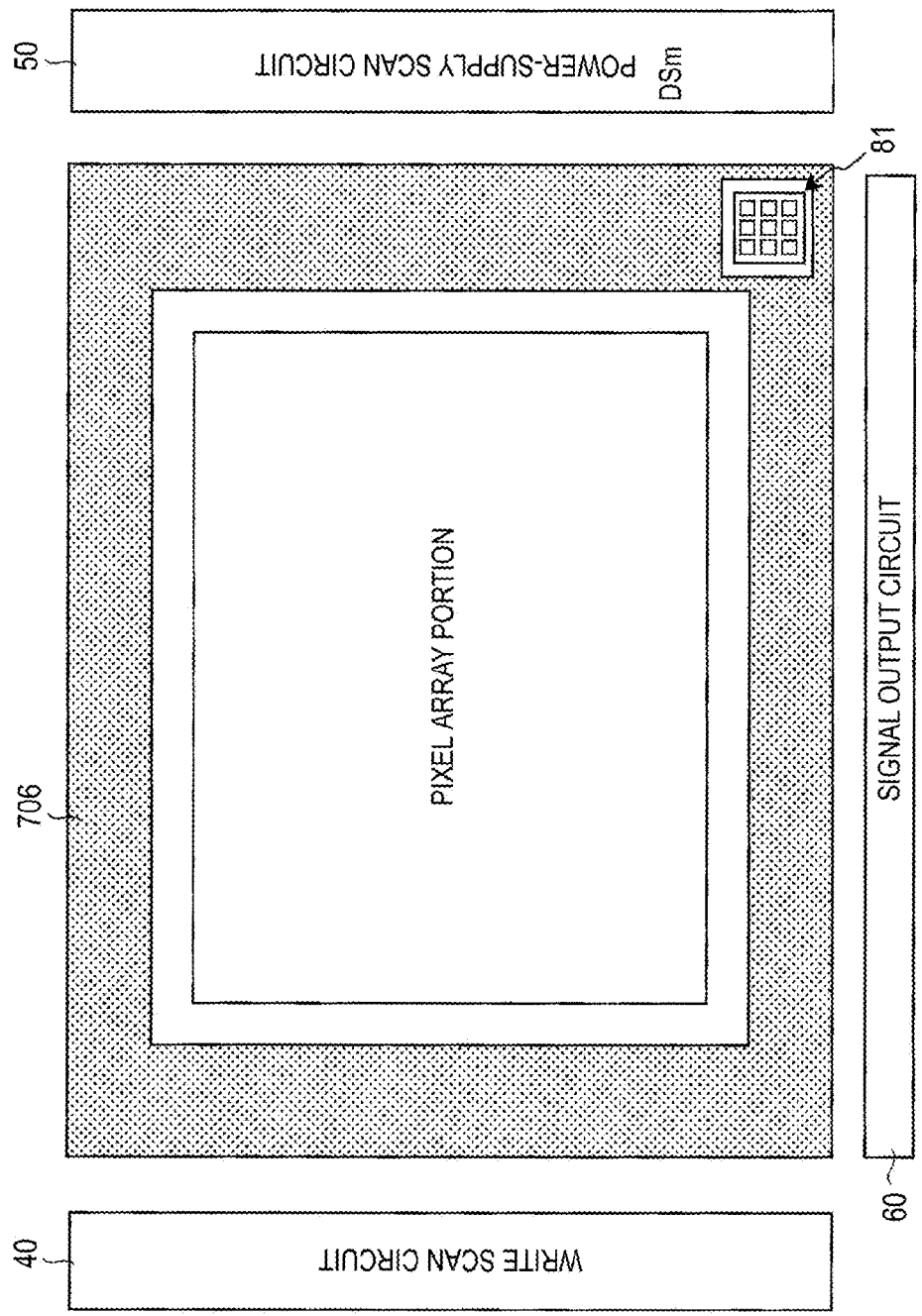

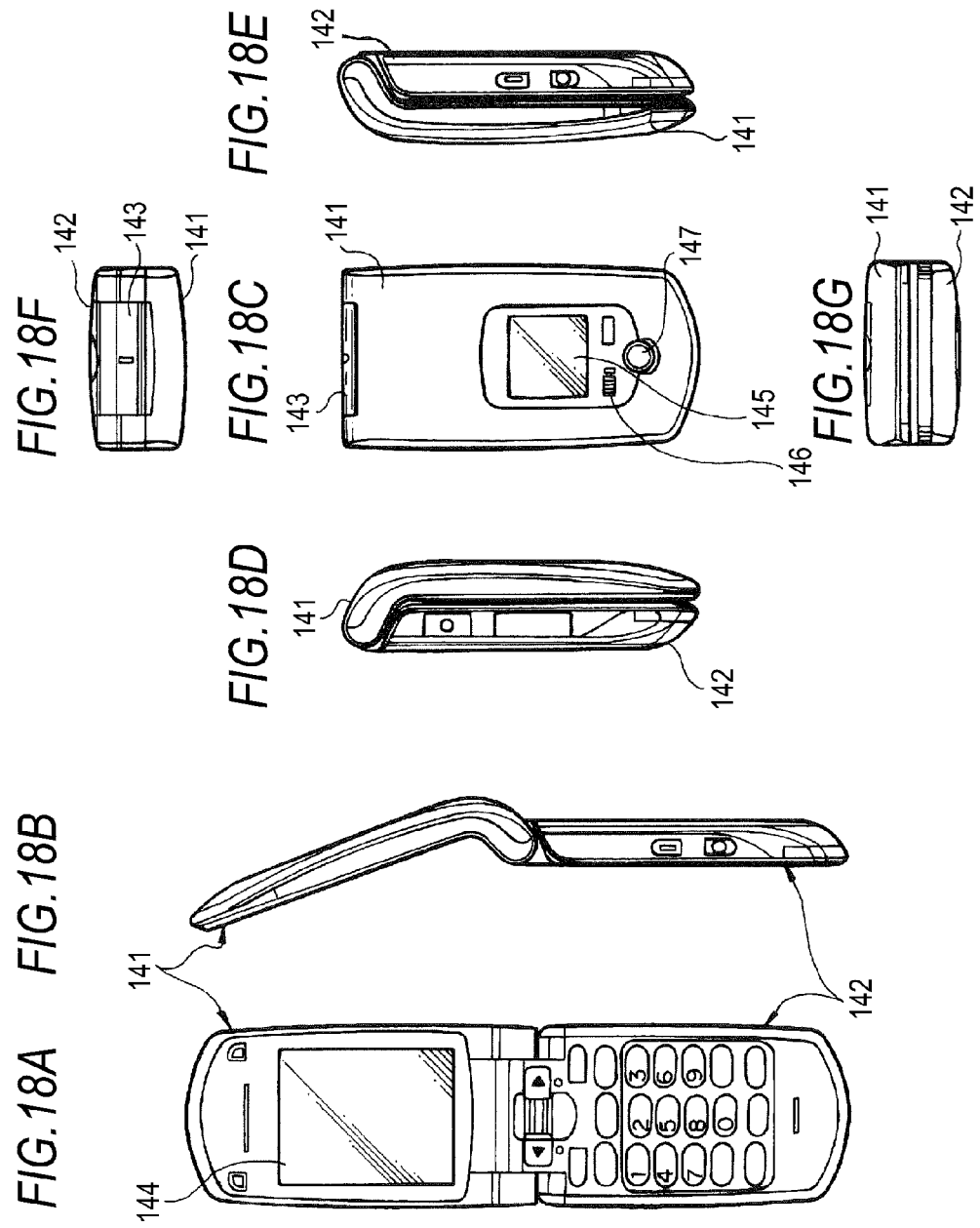

DISPLAY DEVICE AND ELECTRONIC APPARATUS

BACKGROUND OF THE INVENTION

1. Field of the Invention

The present invention relates to a display device and an electronic apparatus. The invention particularly relates to a flat-panel display device including pixels that are arranged two-dimensionally in a matrix and have electro-optic devices; and also to an electronic apparatus including the display device.

2. Description of the Related Art

In recent years, in the field of display devices for displaying images, a flat-panel, light-emitting display device has been spreading rapidly. In such a light-emitting display, pixels (pixel circuits) having devices of a light-emitting type (light-emitting devices) as electro-optic devices are arranged in a matrix. A known light-emitting device is an EL (Electro Luminescence) device that uses the phenomenon of light emission in response to the application of an electric field to an organic thin film. An organic EL device is an electro-optic device of a so-called current-driven type, and the emission luminance thereof varies depending on the value of the current flowing through the device.

An organic EL display device having organic EL devices as electro-optic devices have the following characteristics. That is, an organic EL device can be driven at a voltage not more than 10 V, and its power consumption is thus small. Because an organic EL device is a light-emitting device, an organic EL display device has higher image visibility as compared with a liquid crystal display that displays an image by controlling the intensity of light from a light source for each pixel using liquid crystals. Further, an organic EL display device does not require an illuminating member such as a backlight, so can be readily reduced in weight and thickness. In addition, because an organic EL device has an extremely high response speed of several microseconds or so, no afterimage occurs at the time of displaying a moving image.

Meanwhile, it is generally known that the luminance efficiency of an organic EL device decreases in proportion to the light-emission amount and the light-emission time. In a display device including such organic EL devices, when, like time display, a fixed image pattern is repeatedly displayed in a specific display area on the display screen, the organic EL devices in the specific display area degrade more quickly as compared with organic EL devices in other display areas.

The degraded organic EL devices in the specific display area have relatively lower luminance than organic EL devices in other display areas. As a result, the specific display area is recognized as unevenness in luminance. That is, when, for example, a fixed image pattern is repeatedly displayed in a specific display area on the display screen, some display portion in the specific display area is recognized as permanent unevenness in luminance, causing so-called burn-in.

To solve the burn-in problem has been the most important issue for organic EL display devices and other light-emitting display devices. In related art, for the purpose of correcting burn-in from a signal processing perspective, dummy pixels that do not contribute to image display are provided outside a pixel array portion (display area), and the degradation of the luminance of the dummy pixels is detected so as to correct burn-in based on the detection results (see, e.g., JP-A-2007-156044).

SUMMARY OF THE INVENTION

A photodetector is used for detecting the luminance degradation of a dummy pixel. In related art, such a photodetector is positioned on the front side (light-emitting-surface side) of a display panel, facing the light-emitting surface of a dummy pixel. In such a case where a photodetector is positioned on the front side of a display panel, the panel module has increased thickness, and it thus is difficult to take advantage of the small thickness of the light-emitting display device.

Meanwhile, on the rear side of a display panel, a driver for driving the display panel and like modules are present. Therefore, the provision of a photodetector on the rear side of a display panel does not increase the thickness of the panel module. However, when a photodetector is positioned on the rear side of a display panel, the luminance of a dummy pixel is detected on the opposite side from the light-emitting surface. Because of the darker environment as compared with detection on the light-emitting-surface side, it is difficult to detect the dummy pixel luminance.

Thus, it is desirable to provide a display device that, when a photodetector is provided on the opposite side of a display panel from the light-emitting surface, allows efficient detection of the dummy pixel luminance; and an electronic apparatus including the display device.

A display device according to an embodiment of the invention includes a dummy pixel provided on a display panel; a reflection film provided on a light-emitting-surface side of the display panel for reflecting light emitted from the dummy pixel; a photodetector provided on an opposite side of the display panel from the light-emitting surface for detecting the light emitted from the dummy pixel and reflected from the reflection film; and a correction circuit for correcting, based on the results of detection by the photodetector, the luminance of effective pixels that contribute to image display.

In the display device thus configured, the photodetector is provided on the opposite side of the display panel from the light-emitting surface thereof, for example, on the rear side of the display panel. As a result, because a driver module for driving a pixel on the display panel is present on the rear side of the display panel, the panel module does not have increased thickness. Further, light emitted from the dummy pixel is reflected from the reflection film and thereby directed to the photodetector. As a result, even though the photodetector is provided on the rear side of the display panel, the luminance of the dummy pixel can be efficiently detected.

According to the embodiment of the invention, even when the photodetector is positioned on the opposite side of a display panel from the light-emitting surface thereof, the luminance of the corresponding dummy pixel can be efficiently detected.

BRIEF DESCRIPTION OF THE DRAWINGS

FIG. 3 is a timing waveform diagram for explaining the basic circuit operation of an organic EL display device according to an embodiment of the invention.

FIG. 11 is a cross section showing the configuration of a dummy pixel including a photodetector according to Example 1.

FIG. 12 is a flat diagram showing an example of the arrangement of auxiliary wires.

FIG. 15A is a perspective view from the front, and FIG. 15B is a perspective view from the back.

FIGS. 18A to 18G show the appearance of a mobile phone according to an embodiment of the invention. FIG. 18A is a front view of the mobile phone opened, and FIG. 18B is a side view thereof. FIG. 18C is a front view of the mobile phone closed, FIG. 18D is a left side view thereof, FIG. 18E is a right side view thereof, FIG. 18F is a top view thereof, and FIG. 18G is a bottom view thereof.

DESCRIPTION OF PREFERRED EMBODIMENTS

Hereinafter, some embodiments for carrying out the invention (hereinafter referred to as "embodiments") will be explained in detail with reference to the drawings. Explanations will be given in the following order.

1. Display Device to which the Invention is applied (Example of organic EL display device)
  1-1. System Configuration
  1-2. Circuit Operation
2. Embodiments
  2-1. Burn-in Correction Circuit
  2-2. Example 1 (Example in which a photodetector is provided on the rear side of a panel)
  2-3. Example 2 (Example in which a photodetector is incorporated in a panel)
3. Alternative Embodiments
4. Application Examples (Electronic apparatus)

1. Display Device to which the Invention is Applied

[1-1. System Configuration]

Figure 1:
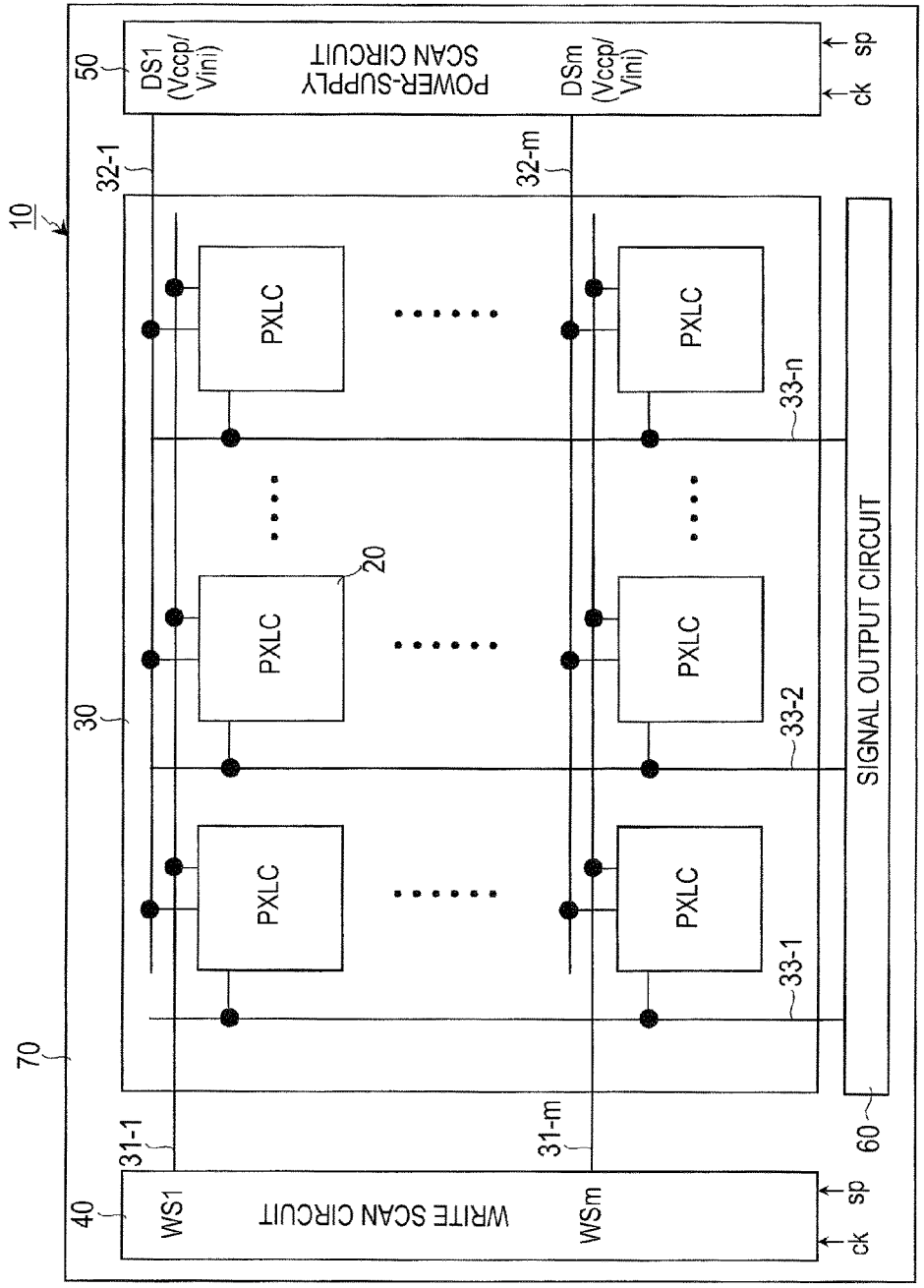
FIG. 1 is a system block diagram schematically showing the configuration of an organic EL display device according to an embodiment of the invention.

FIG. 1 is a system block diagram schematically showing the configuration of an active-matrix display device according to an embodiment of the invention. The embodiment will be described with reference to, as an example, the case of an active-matrix organic EL display device that contains as a light-emitting device of a pixel (pixel circuit) a current-driven, electro-optic device whose emission luminance varies depending on the value of the current flowing through the device, such as an organic EL device.

As shown in FIG. 1, an organic EL display device 10 of this application example includes a pixel array portion 30 where a plurality of pixels 20 each having an organic EL device are two-dimensionally arranged in a matrix; and a driving portion around the pixel array portion 30. The driving portion includes a write scan circuit 40, a power-supply scan circuit 50 that serves as a power supply portion, a signal output circuit 60, and the like, and drives the pixels 20 in the pixel array portion 30.

When the organic EL display device 10 is designed for color display, each pixel includes a plurality of sub pixels, and the sub pixels serve as the pixels 20. More specifically, in a display device for color display, one pixel has three sub pixels, i.e., a sub pixel that emits red light (R), a sub pixel that emits green light (G), and a sub pixel that emits blue light (B).

However, a pixel is not limited to the combination of the sub pixels of the primary colors RGB. Sub pixels of one or more additional colors may be added to the sub pixels of the primary colors to give a pixel. More specifically, for example, for the purpose of improving the luminance, a sub pixel that emits white light (W) may be added to form a pixel. Alternatively, for the purpose of increasing the range of color reproduction, at least one sub pixel that emits light of a complementary color may be added to form a pixel.

In the pixel array portion 30, the pixels 20 are arranged in m rows and n columns. Further, scan lines 31-1 to 31-$m$ and power supply lines 32-1 to 32-$m$ are provided to extend in the row direction (the direction in which pixels in a row are arranged), and each row of pixels is provided with such a scan line and a power supply line. Likewise, signal lines 33-1 to 33-$n$ are provided to extend in the column direction (the direction in which pixels in a column are arranged), and each column of pixels is provided with such a signal line.

The scan lines 31-1 to 31-$m$ are each connected to the output end of the corresponding row of the write scan circuit 40. The power supply lines 32-1 to 32-$m$ are each connected to the output end of the corresponding row of the power-supply scan circuit 50. The signal lines 33-1 to 33-$n$ are each connected to the output end of the corresponding column of the signal output circuit 60.

The pixel array portion 30 is usually formed on a transparent insulating substrate such as a glass substrate. The organic EL display device 10 thus has a flat panel structure. The drive circuit of each of the pixels 20 in the pixel array portion 30 can be formed using an amorphous silicon TFT or a low-temperature polysilicon TFT. In the case of using a low-temperature polysilicon TFT, as shown in FIG. 1, the write scan circuit 40, the power-supply scan circuit 50, and the signal output circuit 60 can also be mounted on the display panel (substrate) 70 having formed thereon the pixel array portion 30.

The write scan circuit 40 is formed of a shift register for sequentially shifting (transferring) a start pulse sp in synchronization with the clock pulse ck, etc. At the time of writing video signals in the pixels 20 in the pixel array portion 30, the write scan circuit 40 sequentially supplies write scan signals WS (WS1 to WSm) to the scan lines 31-1 to 31-$m$, thereby sequentially scanning the pixels 20 in the pixel array portion 30 row by row (line progressive scan).

The power-supply scan circuit 50 is formed of a shift register for sequentially shifting a start pulse sp in synchronization with a clock pulse ck, etc. In synchronism with the line progressive scan by the write scan circuit 40, the power-supply scan circuit 50 supplies power supply potentials DS (DS1 to DSm) to the power supply lines 32-1 to 32-*m*. Each power supply potential DS switches between a first power supply potential Vccp and a second power supply potential Vini lower than the first power supply potential Vccp. As mentioned later, switching of the power supply potential DS between Vccp and Vini controls each pixel 20 to or not to emit light.

The signal output circuit 60 is configured to serve as a selector, and selectively outputs the signal voltage Vsig of a video signal (hereinafter sometimes simply referred to as a "signal voltage Vsig") corresponding to luminance information supplied from the signal source (not illustrated) or a reference potential Vofs. The reference potential Vofs herein is a potential that serves as a reference for the signal voltage Vsig of a video signal (e.g., a potential equivalent to the black level of a video signal).

The signal voltage Vsig/the reference potential Vofs output from the signal output circuit 60 is written in each of the pixels 20 in the pixel array portion 30 row by row via the signal lines 33-1 to 33-*n*. That is, the drive system of the signal output circuit 60 is the line progressive writing style, and writes the signal voltage Vsig in a row-by-row (line-by-line) fashion.

(Pixel Circuit)

Figure 2:
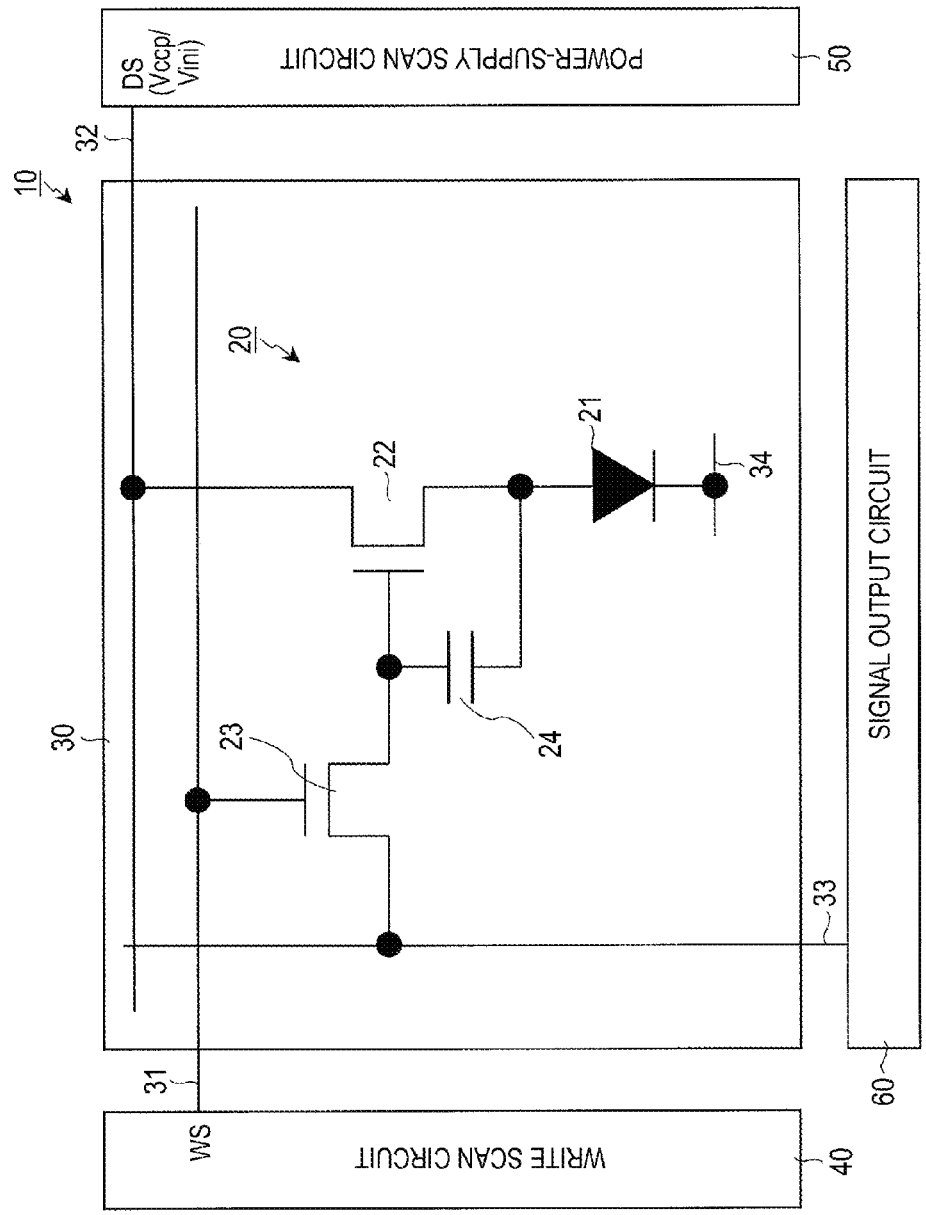
FIG. 2 is a circuit diagram showing the circuitry of a pixel (pixel circuit) of an organic EL display device according to an embodiment of the invention.

FIG. 2 is a circuit diagram showing the specific circuitry of a pixel (pixel circuit) 20.

As shown in FIG. 2, the pixel 20 includes a light-emitting device, such as an organic EL device 21 that is a current-driven electro-optic device whose emission luminance varies depending on the value of the current flowing through the device; and a drive circuit for driving the organic EL device 21. The cathode electrode of the organic EL device 21 is connected to a common power supply line 34 that is connected to all the pixels 20 in common (so-called solid wiring).

The drive circuit for driving the organic EL device 21 includes a drive transistor 22, a write transistor 23, and a holding capacitor 24. Here, N-channel transistors, such as TFTs (thin film transistors), are used as the drive transistor 22 and the write transistor 23. However, this is merely an example, and the combination of conductivity types of the drive transistor 22 and the write transistor 23 is not limited thereto.

In the case where N-channel TFTs are used as the drive transistor 22 and the write transistor 23, the amorphous silicon (a-Si) process can be employed. Use of the a-Si process allows a TFT-forming substrate to be produced at lower cost, whereby the cost for the organic EL display device 10 can be reduced. Further, when the drive transistor 22 and the write transistor 23 have the same conductivity type, the transistors 22 and 23 can be produced in the same process, contributing to cost reduction.

One electrode (source/drain electrode) of the drive transistor 22 is connected to the anode electrode of the organic EL device 21, and the other electrode (drain/source electrode) is connected to a power supply line 32 (32-1 to 32-*m*).

One electrode (source/drain electrode) of the write transistor 23 is connected to a signal lines 33 (33-1 to 33-*n*), and the other electrode (drain/source electrode) is connected to the gate electrode of the drive transistor 22. The gate electrode of the write transistor 23 is connected to a scan line 31 (31-1 to 31-*m*).

In the drive transistor 22 and the write transistor 23, one electrode is a metal wire electrically connected to the source/drain region, and the other electrode is a metal wire electrically connected to the drain/source region. Depending on the relation between the potentials of the two electrodes, one electrode may be a source electrode or a drain electrode, and the other electrode may be a drain electrode or a source electrode.

One electrode of the holding capacitor 24 is connected to the gate electrode of the drive transistor 22, and the other electrode is connected to the other electrode of the drive transistor 22 and the anode electrode of the organic EL device 21.

The drive circuit for the organic EL device 21 is not limited to the circuitry including two transistors, i.e., the drive transistor 22 and the write transistor 23, and one capacitor, i.e., the holding capacitor 24.

An example of a different circuit is a circuitry in which an auxiliary capacitor is optionally provided in such a manner that one electrode thereof is connected to the anode electrode of the organic EL device 21 and the other electrode is connected to a fixed potential so that the auxiliary capacitor functions to compensate for the lack of capacitance of the organic EL device 21. Another example is a circuitry in which a switching transistor is connected to the drive transistor 22 in series, and the switching transistor is switched between conducting and non-conducting states to control the organic EL device 21 to or not to emit light.

In the pixel 20 thus configured, the write transistor 23 is brought into a conducting state in response to a high-active write scan signal WS applied to the gate electrode thereof from the write scan circuit 40 via the scan line 31. The write transistor 23 thereby samples the signal voltage Vsig of a video signal corresponding to luminance information supplied from the signal output circuit 60 via the signal line 33 or the reference potential Vofs, and writes the same in the pixel 20. The written signal voltage Vsig or reference potential Vofs is applied to the gate electrode of the drive transistor 22 and also stored in the holding capacitor 24.

When the potential DS of the power supply line 32 (32-1 to 32-*m*) is the first potential Vccp, the drive transistor 22 operates in the saturation region with one electrode thereof serving as the drain electrode and the other electrode as the source electrode. The drive transistor 22 thus receives current supplied from the power supply line 32, and current-drives the organic EL device 21 to emit light. More specifically, the drive transistor 22 operates in the saturation region, whereby drive current having a current value corresponding to the voltage value of the signal voltage Vsig stored in the holding capacitor 24 is supplied to the organic EL device 21. The organic EL device 21 is thus current-driven to emit light.

Further, when the power supply potential DS changes from the first power supply potential Vccp to the second power supply potential Vini, the drive transistor 22 operates as a switch transistor with one electrode thereof serving as the source electrode and the other electrode as the drain electrode. The drive transistor 22 thus stops supplying the drive current to the organic EL device 21, whereby the organic EL device 21 enters a non-light-emission state. That is, the drive transistor 22 also functions as a transistor that controls the organic EL device 21 to or not to emit light.

The switching operation of the drive transistor 22 creates a period in which the organic EL device 21 emits no light (non-light-emission period), allowing control over the ratio between the light-emission and non-light-emission periods (duty) of the organic EL device 21. The duty control makes it possible to reduce blurring of afterimages caused by a pixel emitting light during one frame period. As a result, the moving image quality can be particularly improved.

Of the first and second power supply potentials Vccp and Vini selectively supplied from the power-supply scan circuit 50 via the power supply line 32, the first power supply potential Vccp is a power supply potential for supplying drive current to the drive transistor 22 for driving the organic EL device 21 to emit light. The second power supply potential Vini is a power supply potential for reverse-biasing the organic EL device 21. The second power supply potential Vini is set lower than the reference potential Vofs. For example, when the threshold voltage of the drive transistor 22 is Vth, the second power supply potential Vini is set lower than, preferably sufficiently lower than, Vofs−Vth.

[1-2. Circuit Operation]

Hereinafter, the basic circuit operation of the organic EL display device 10 thus configured will be explained with reference to the timing waveform diagram of FIG. 3 and also to the operation diagrams of FIGS. 4A to 4D and 5A to 5D. In the operation diagrams of FIGS. 4A to 4D and 5A to 5D, the write transistor 23 is represented by a switch symbol for simplification of drawing. An equivalent capacitor 25 of the organic EL device 21 is also illustrated therein.

The timing waveform diagram of FIG. 3 shows changes in the potential (write scan signal) WS of the scanning line 31, the potential (power supply potential) DS of the power supply line 32, the potential (Vsig/Vofs) of the signal line 33, and the gate potential Vg and the source potential Vs of the drive transistor 22.

(Light-Emission Period of Previous Frame)

In the timing waveform diagram of FIG. 3, the period preceding the time t11 is the light-emission period of the organic EL device 21 in a previous frame (field). During the light-emission period in the previous frame, the potential DS of the power supply line 32 is the first power supply potential (hereinafter referred to as "high potential") Vccp, and the write transistor 23 is in a non-conducting state.

Figure 4A:
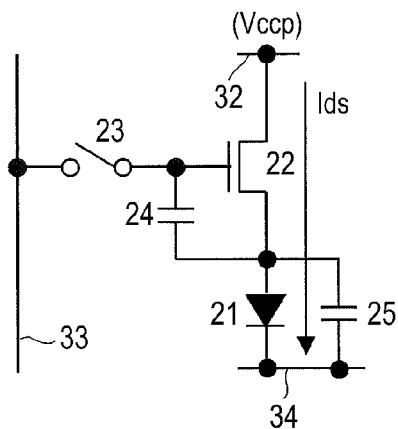
FIGS. 4A to 4D are operation diagrams illustrating the basic circuit operation (first example) of an organic EL display device according to an embodiment of the invention.

The drive transistor 22 is designed to operate in the saturation region at this time. Accordingly, as shown in FIG. 4A, drive current (drain-source current) Ids corresponding to the gate-source voltage Vgs of the drive transistor 22 is supplied to the organic EL device 21 from the power supply line 32 via the drive transistor 22. The organic EL device 21 thus emits light at the luminance corresponding to the current value of the drive current Ids.

(Threshold Correction Preparation Period)

Figure 4B:
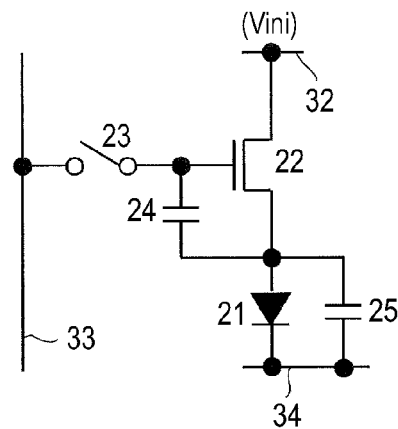

At the time t11, a new frame (present frame) of line progressive scan starts. Thus, as shown in FIG. 4B, relative to the reference potential Vofs of the signal line 33, the potential DS of the power supply line 32 changes from the high potential Vccp to the second power supply potential (hereinafter referred to as "low potential") Vini that is sufficiently lower than Vofs−Vth.

Expressing the threshold voltage of the organic EL device 21 as Vthel and the potential (cathode potential) of the common power supply line 34 as Vcath, when the low potential Vini<Vthel+Vcath, the source potential Vs of the drive transistor 22 is nearly equal to the low potential Vini. As a result, the organic EL device 21 is reverse-biased and deactivated.

Figure 4C:
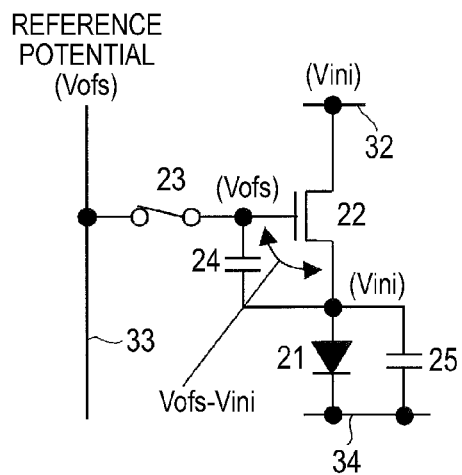

Subsequently, at the time t12, the potential WS of the scanning line 31 makes a transition from the low-potential side to the high-potential side, whereby the write transistor 23 enters a conducting state as shown in FIG. 4C. At this time, the reference potential Vofs is supplied from the signal output circuit 60 to the signal line 33, and the gate potential Vg of the drive transistor 22 is thus the reference potential Vofs. In addition, the source potential Vs of the drive transistor 22 is the potential Vini that is sufficiently lower than the reference potential Vofs.

At this time, the gate-source voltage Vgs of the drive transistor 22 is Vofs−Vini. Here, unless Vofs−Vini is larger than the threshold voltage Vth of the drive transistor 22, it is difficult to perform the below-mentioned threshold correction processing. Therefore, the potential relation so that Vofs−Vini>Vth is necessary.

Such processing, in which the gate potential Vg and the source potential Vs of the drive transistor 22 are fixed (determined) to the reference potential Vofs and the low potential Vini, respectively, and thus initialized, is done in preparation for the below-mentioned threshold correction processing (threshold correction preparation). Therefore, the reference potential Vofs and the low potential Vini serve as the initialization potentials of the gate potential Vg and the source potential Vs of the drive transistor 22, respectively.

(Threshold Correction Period)

Figure 4D:
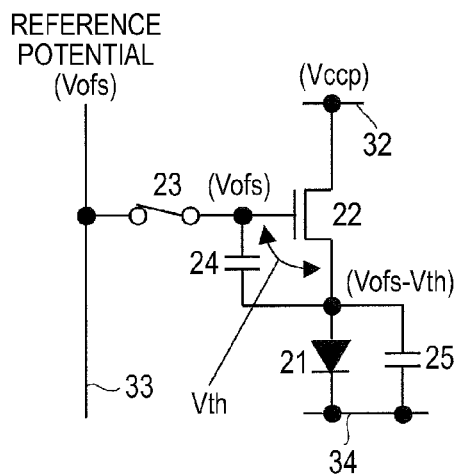

Subsequently, at the time t13, as shown in FIG. 4D, the potential DS of the power supply line 32 changes from the low potential Vini to the high potential Vccp, initiating the threshold correction processing with the gate potential Vg of the drive transistor 22 being maintained. That is, the source potential Vs of the drive transistor 22 starts increasing toward the potential obtained by subtracting the threshold voltage Vth of the drive transistor 22 from the gate potential Vg.

For convenience, such processing, in which, taking as a reference the initialization potential Vofs of the gate electrode of the drive transistor 22, the source potential Vs is changed toward the potential obtained by subtracting the threshold voltage Vth of the drive transistor 22 from the initialization potential Vofs, is called as the threshold correction processing. As the threshold correction processing progresses, eventually, the gate-source voltage Vgs of the drive transistor 22 converges to the threshold voltage Vth of the drive transistor 22. The voltage equal to the threshold voltage Vth is stored in the holding capacitor 24.

During the threshold correction processing (threshold correction period), in order for current to flow toward the holding capacitor 24 and not to flow toward the organic EL device 21, the potential Vcath of the common power supply line 34 is set so that the organic EL device 21 is cut off.

Figure 5A:
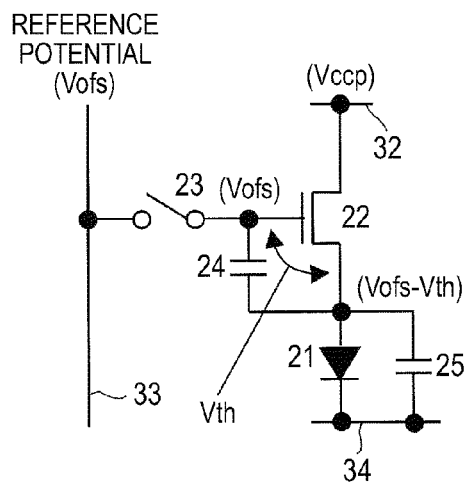
FIGS. 5A to 5D are operation diagrams illustrating the basic circuit operation (second example) of an organic EL display device according to an embodiment of the invention.

Subsequently, at the time t14, as shown in FIG. 5A, the potential WS of the scanning line 31 makes a transition to the low-potential side, whereby the write transistor 23 enters a non-conducting state. At this time, the gate electrode of the drive transistor 22 is electrically disconnected from the signal line 33 and thus left floating. However, because the gate-source voltage Vgs is equal to the threshold voltage Vth of the drive transistor 22, the drive transistor 22 is in the cut-off state. Therefore, no drain-source current Ids flows through the drive transistor 22.

(Signal Writing and Mobility Correction Period)

Figure 5B:
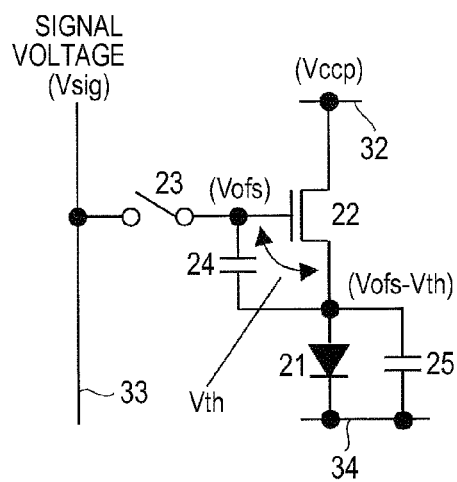
Figure 5C:
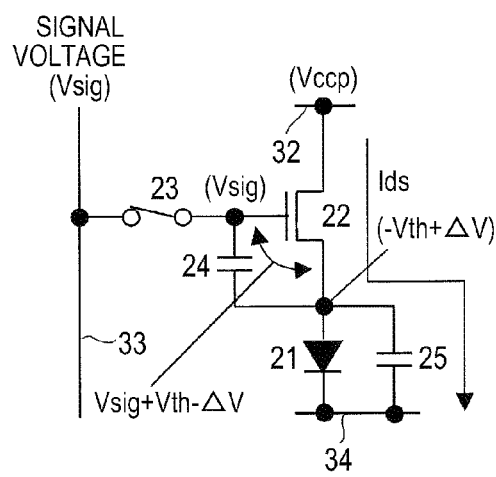

Subsequently, at the time t15, as shown in FIG. 5B, the potential of the signal line 33 changes from the reference potential Vofs to the signal voltage Vsig of a video signal. Then, at the time t16, the potential WS of the scanning line 31 makes a transition to the high-potential side, whereby, as shown in FIG. 5C, the write transistor 23 enters a conducting state. The write transistor 23 thereby samples the signal voltage Vsig of a video signal and writes the same in the pixel 20.

The write transistor 23 thus writes the signal voltage Vsig. As a result, the gate potential Vg of the drive transistor 22 is the signal voltage Vsig. Then, at the time when the drive transistor 22 is driven by the signal voltage Vsig of a video signal, the threshold voltage Vth of the drive transistor 22 is cancelled by the voltage equal to the threshold voltage Vth stored in the holding capacitor 24. The detail of the principle of the threshold cancellation will be described later.

At this time, the organic EL device 21 is in the cut-off state (high-impedance state). Therefore, the current (drain-source current Ids), which flows from the power supply line 32 into the drive transistor 22 depending on the signal voltage Vsig of a video signal, flows into the equivalent capacitor 25 of the organic EL device 21 to initiate charging of the equivalent capacitor 25.

As the equivalent capacitor 25 of the organic EL device 21 is charged, the source potential Vs of the drive transistor 22 increases with time. By then, variation in the threshold voltage Vth of the drive transistor 22 among pixels is already canceled, and the drain-source current Ids of the drive transistor 22 depends on the mobility μ of the drive transistor 22.

Assuming that the ratio of the holding voltage Vgs in the holding capacitor 24 to the signal voltage Vsig of a video signal, i.e., the write gain G, is 1 (ideal value), then, when the source potential Vs of the drive transistor 22 increases to a potential of Vofs−Vth+ΔV, the gate-source voltage Vgs of the drive transistor 22 is Vsig−Vofs+Vth−ΔV.

That is, the increment ΔV of the source potential Vs of the drive transistor 22 is subtracted from the voltage (Vsig−Vofs+Vth) stored in the holding capacitor 24, in other wards, the increment ΔV acts to discharge the charges in the holding capacitor 24; thus, negative feedback is applied. Therefore, the increment ΔV of the source potential Vs is the feedback amount of negative feedback.

In this way, the feedback amount ΔV of negative feedback corresponding to the drain-source current Ids flowing through the drive transistor 22 is applied to the gate-source voltage Vgs, whereby the dependence of the drain-source current Ids of the drive transistor 22 on the mobility μ can be canceled. This cancelation processing is the mobility correction processing that corrects variation in the mobility μ of the drive transistor 22 among pixels.

More specifically, with an increase in the signal amplitude Vin (=Vsig−Vofs) of a video signal written in the gate electrode of the drive transistor 22, the drain-source current Ids increases, and the absolute value of the feedback amount ΔV of negative feedback thus also increases. Therefore, the mobility correction processing appropriate for the emission luminance level is performed.

Further, when the signal amplitude Vin of a video signal is constant, the absolute value of the feedback amount ΔV of negative feedback increases with an increase in the mobility μ of the drive transistor 22. Therefore, variation in mobility μ among pixels can be eliminated. Therefore, the feedback amount ΔV of negative feedback can also be considered as the amount of mobility correction. The detail of the principle of mobility correction will be described later.

(Light-Emission Period)

Figure 5D:
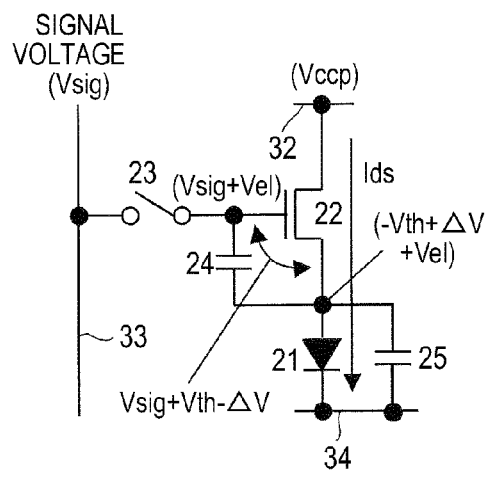

Subsequently, at the time t17, the potential WS of the scanning line 31 makes a transition to the low-potential side, whereby the write transistor 23 enters a non-conducting state, as shown in FIG. 5D. The gate electrode of the drive transistor 22 is thereby electrically disconnected from the signal line 33 and thus left floating.

When the gate electrode of the drive transistor 22 is floating, the holding capacitor 24 is connected between the gate and the source of the drive transistor 22. Therefore, in conjunction with changes in the source potential Vs of the drive transistor 22, the gate potential Vg also changes. Such an operation in which the gate potential Vg of the drive transistor 22 changes in conjunction with changes in the source potential Vs is the bootstrap operation by the holding capacitor 24.

When the gate electrode of the drive transistor 22 is left floating, and simultaneously the drain-source current Ids of the drive transistor 22 starts flowing through the organic EL device 21, the anode potential of the organic EL device 21 increases with the current Ids.

When the anode potential of the organic EL device 21 exceeds Vthel+Vcath, this allows drive current to start flowing through the organic EL device 21, whereby the organic EL device 21 starts emitting light. The increase in the anode potential of the organic EL device 21 is an increase in the source potential Vs of the drive transistor 22. With an increase in the source potential Vs of the drive transistor 22, due to the bootstrap operation by the holding capacitor 24, the gate potential Vg of the drive transistor 22 also increases.

Then, assuming that the bootstrap gain is 1 (ideal value), then the increment of the gate potential Vg is equal to the increment of the source potential Vs. Therefore, during the light-emission period, the gate-source voltage Vgs of the drive transistor 22 is Vsig−Vofs+Vth−ΔV and is maintained constant. At the time t18, the potential of the signal line 33 changes from the signal voltage Vsig of a video signal to the reference potential Vofs.

In the series of circuit operations described above, the processing operations of threshold correction preparation, threshold correction, signal voltage Vsig writing (signal writing), and mobility correction are all performed in one horizontal scan period (1H). The processing operations of signal writing and mobility correction are performed in parallel in the period from the time t16 to the time t17.

The case of using a drive method that performs the threshold correction processing only once has been taken as an example; however, this is merely an example and the drive method is not limited thereto. For example, in addition to a period 1H in which the threshold correction processing is performed together with mobility correction and signal writing, it is also possible to divide the processing and perform multiple operations over a plurality of horizontal scan periods preceding the period 1H. That is, the drive method may employ so-called divided threshold correction.

In the case of using such a drive method that employs divided threshold correction, even when the period of one horizontal scan period is reduced due to an increase in the number of pixels accompanying the improvement in resolution, a sufficient period of time can be ensured for the threshold correction period over a plurality of horizontal scan periods. Therefore, the threshold correction processing can be reliably performed.

[Principle of Threshold Cancellation]

The principle of cancellation of the threshold of the drive transistor 22 (i.e., threshold correction) will be explained hereinafter. The drive transistor 22 is designed to operate in the saturation region, and thus operates as a constant current source. Accordingly, a constant drain-source current (drive current) Ids is supplied from the drive transistor 22 to the organic EL device 21, which is given by the following equation (1):

$$Ids = (1/2) * \mu (W/L) Cox (Vgs - Vth)^2 \quad (1),$$

wherein W is the channel width of the drive transistor 22, L is the channel length, and Cox is the gate capacitance/unit area.

Figure 6:
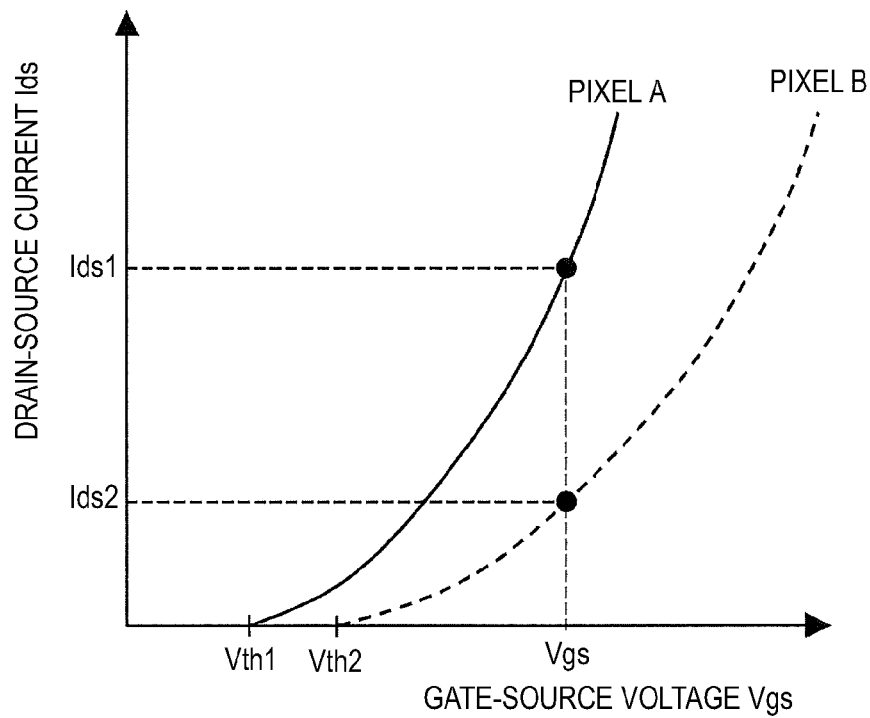
FIG. 6 is a characteristic diagram for explaining problems caused by variation in the threshold voltage Vth of a drive transistor.

With respect to the drain-source current Ids and the gate-source voltage Vgs of the drive transistor 22, FIG. 6 shows the Ids-Vgs characteristics.

As shown in the characteristic diagram, unless the cancellation processing on variation in the threshold voltage Vth of the drive transistor 22 is performed for each pixel, when the threshold voltage Vth is Vth1, the drain-source current Ids corresponding to the gate-source voltage Vgs is Ids1.

Meanwhile, when the threshold voltage Vth is Vth2 (Vth2>Vth1), the drain-source current Ids corresponding to the same gate-source voltage Vgs is Ids2 (Ids2<Ids). That is, as the threshold voltage Vth of the drive transistor 22 changes, the drain-source current Ids also changes even when the gate-source voltage Vgs is constant.

As mentioned above, in the pixel (pixel circuit) 20 configured as above, the gate-source voltage Vgs of the drive transistor 22 at the time of light emission is Vsig−Vofs+Vth−ΔV. If this is substituted into the equation (1), then the drain-source current Ids is expressed by the following equation (2):

$$Ids=(1/2)*\mu(W/L)Cox(Vsig-Vofs-\Delta V)^2 \qquad (2).$$

That is, the term of the threshold voltage Vth of the drive transistor 22 is canceled, and the drain-source current Ids supplied from the drive transistor 22 to the organic EL device 21 is independent of the threshold voltage Vth of the drive transistor 22. As a result, even when the threshold voltage Vth of the drive transistor 22 varies among pixels due to variation in the manufacturing processes for the drive transistor 22 or the time-dependent variation, the drain-source current Ids does not vary. Therefore, the emission luminance of the organic EL device 21 can be maintained constant.

[Principle of Mobility Correction]

Figure 7:
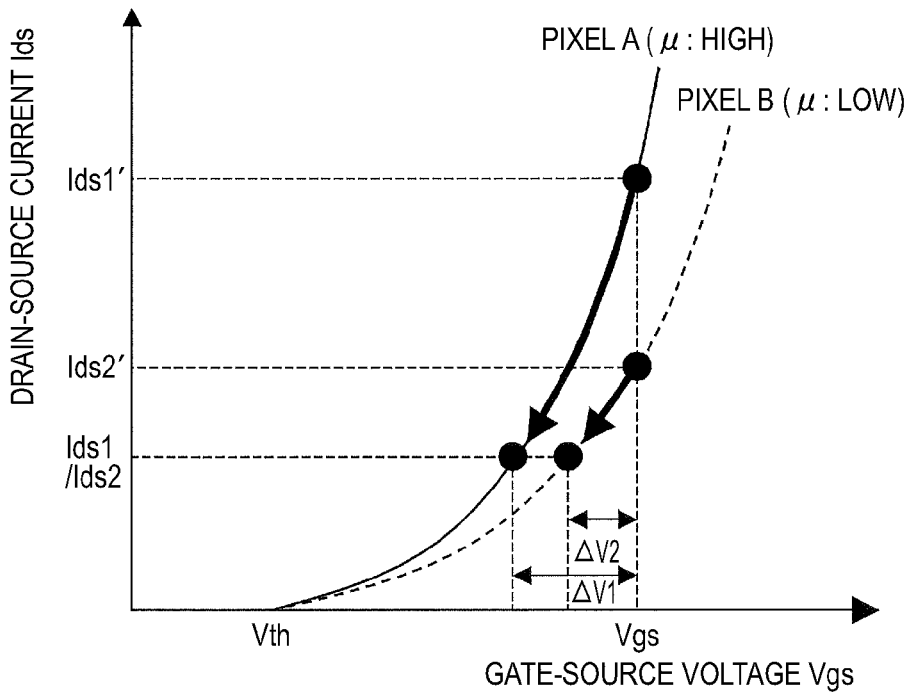
FIG. 7 is a characteristic diagram for explaining problems caused by variation in the mobility $\mu$ of a drive transistor.

The principle of correction of the mobility of the drive transistor 22 will be explained hereinafter. FIG. 7 shows characteristic curves comparing a pixel A having a relatively high mobility μ of the drive transistor 22 with a pixel B having a relatively low mobility μ of the drive transistor 22. When the drive transistor 22 is a polysilicon thin film transistor or the like, it will be inevitable that the mobility μ varies among pixels as in the case of the pixels A and B.

On the condition that there is a variation in mobility μ between the pixel A and the pixel B, the case where signal amplitudes Vin (=Vsig−Vofs) at the same level are written in the gate electrodes of the drive transistors 22 of the pixels A and B is considered. In this case, if no correction is made to the mobility μ, then there will be a large difference between the drain-source current Ids1' flowing through the pixel A with high mobility μ and the drain-source current Ids2' flowing through the pixel B with low mobility μ. When such a large difference in drain-source current Ids is present between pixels due to variation in mobility μ between the pixels, this results reduced screen uniformity.

As is clear from the above transistor characteristic equation (1), when the mobility μ is high, the drain-source current Ids is also high. Therefore, the feedback amount ΔV of negative feedback increases with an increase in mobility μ. As shown in FIG. 7, the feedback amount ΔV for the pixel A with high mobility μ is larger than the feedback amount ΔV2 for the pixel B with small mobility.

Accordingly, the mobility correction processing is performed so that the feedback amount ΔV of negative feedback corresponding to the drain-source current Ids of the drive transistor 22 is applied to the gate-source voltage Vgs; i.e., the higher the mobility μ, the larger the feedback amount of negative feedback applied. As a result, variation in mobility μ between the pixels can be suppressed.

Specifically, when the feedback amount ΔV1 of correction is applied to the pixel A with high mobility μ, the drain-source current Ids greatly decreases from Ids1' to Ids1. In contrast, because the feedback amount ΔV2 for the pixel B with low mobility μ is small, the drain-source current Ids decreases from Ids2' to Ids2, which is not a large decrease. As a result, the drain-source current Ids1 of the pixel A and the drain-source current Ids2 of the pixel B are substantially equal to each other, and variation in mobility μ between the pixels is thus corrected.

In summary, with respect to a pixel A and a pixel B with different mobilities μ, the feedback amount ΔV1 for the pixel A with higher mobility μ is larger than the feedback amount ΔV2 for the pixel B with lower mobility μ. That is, a pixel with higher mobility μ receives a greater amount ΔV of feedback, followed by a larger decrease in drain-source current Ids.

Thus, when the feedback amount ΔV of negative feedback corresponding to the drain-source current Ids of the drive transistor 22 is applied to the gate-source voltage Vgs, this equalizes the current value of the drain-source current Ids between pixels with different mobilities μ. As a result, variation in mobility μ between the pixels can be corrected. That is, the mobility correction processing is the processing in which the feedback amount ΔV of negative feedback corresponding to the current flowing through the drive transistor 22 (drain-source current Ids) is applied to the gate-source voltage Vgs of the drive transistor 22.

With respect to the pixel (pixel circuit) 20 shown in FIG. 2, the relation between the signal voltage Vsig of a video signal and the drain-source current Ids of the drive transistor 22 with or without threshold correction and mobility correction will be explained hereinafter with reference to FIGS. 8A to 8C.

Figure 8A:
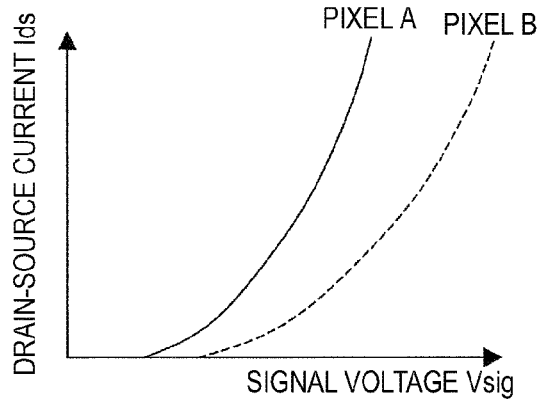
FIGS. 8A to 8C are characteristic diagrams for explaining the relation between the signal voltage Vsig of a video signal and the drain-source current Ids of a drive transistor with or without threshold correction and/or mobility correction.
Figure 8B:
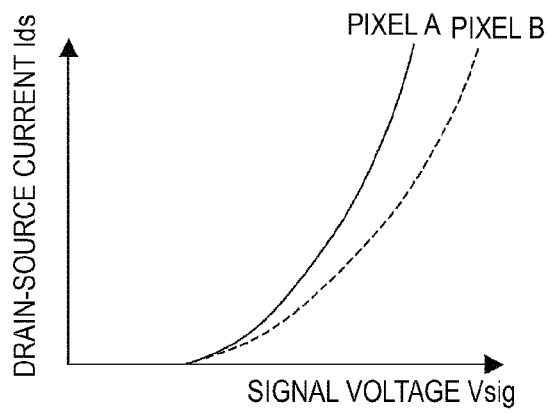
Figure 8C:
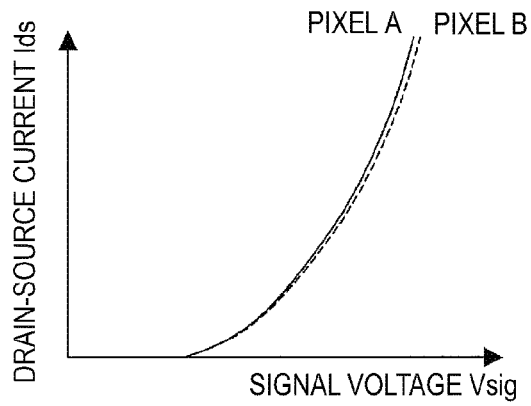

FIG. 8A shows the case where neither the threshold correction nor the mobility correction is performed, FIG. 8B shows the case where not the mobility correction but the threshold correction is performed, and FIG. 8C shows the case where both the threshold correction and the mobility correction are performed. When neither the threshold correction nor the mobility correction is performed, as shown in a FIG. 8A, this results in a large difference in drain-source current Ids between the pixels A and B due to variation in threshold voltage Vth and mobility μ between the pixels A and B.

When only the threshold correction is performed, as shown in FIG. 8B, variation in drain-source current Ids can be reduced to some extent. However, due to variation in mobility μ between the pixels A and B, the difference in drain-source current Ids between the pixels A and B still remains. By performing both the threshold correction and the mobility correction, as shown in FIG. 8C, it is possible to practically eliminate the difference in drain-source current Ids between the pixels A and B due to variation in threshold voltage Vth and mobility μ between the pixels A and B. Therefore, the luminance of the organic EL device 21 does not vary at any gray level, making it possible to display a high-quality image.

In addition to the functions of correcting the threshold and the mobility, the pixel 20 shown in FIG. 2 also has a bootstrap function by the holding capacitor 24 as mentioned above. This provides the following advantages.

That is, even in the case where the source potential Vs of the drive transistor 22 changes due to the time-dependent variation in the I-V characteristics of the organic EL device 21, the bootstrap operation by the holding capacitor 24 allows the gate-source potential Vgs of the drive transistor 22 to be maintained constant. Therefore, the current flowing through the organic EL device 21 does not change and is constant. As a result, the emission luminance of the organic EL device 21 is also maintained constant. Accordingly, even when the I-V characteristics of the organic EL device 21 undergo a time-dependent variation, image display can be achieved without an accompanying decrease in luminance.

2. Embodiments

As mentioned above, in an organic EL display device, degraded organic EL devices in a specific display area have relatively lower luminance than organic EL devices in other display areas, and some display portion in the specific display area is thus recognized as permanent unevenness in luminance, causing burn-in. The specific display area where organic EL devices degrade quickly herein refers to an area where a fixed image pattern is repeatedly displayed, such as a time display area (clock display). In order to avoid burn-in, the organic EL display device 10 has the function of correcting burn-in from a signal processing perspective (burn-in correction function).

For correcting burn-in from a signal processing perspective, dummy pixels that do not contribute to image display are provided outside the pixel array portion (display area) 30 on the display panel 70, and the dummy pixels are driven like the effective pixels (pixels 20) in the display area to cause luminance degradation. Then, the luminance degradation of the dummy pixels is detected using photodetectors.

By forming dummy pixels on the display panel 70 common to the effective pixels 20 that contribute to image display, and driving the dummy pixels fundamentally in the same manner as for the effective pixels 20, the luminance degradation of each pixel 20 can be predicted from the luminance degradation of the dummy pixels. Therefore, based on the results of detection of the luminance degradation of the dummy pixels, the luminance of pixels 20 in the specific display area in which burn-in will occur can be controlled to perform burn-in correction for preventing burn-in.

A dummy pixel has the same configuration as a pixel 20 in the pixel array portion 30, for example. That is, like a pixel 20, a dummy pixel has an organic EL device, a drive transistor, a write transistor, and a holding capacitor. Accordingly, the dummy pixels and the pixels 20 can be produced in the same process, and, therefore, the provision of the dummy pixels rarely increases the difficulty in producing the display panel 70 or requires increased cost.

Taking the configuration in which the luminance degradation of a dummy pixel is detected using a photodetector, this embodiment is characterized by the specific layout of the photodetector relative to the dummy pixel.

Basically, in the configuration of this embodiment, in relation to the dummy pixel provided on the display panel 70, the photodetector is provided on the opposite side of the display panel 70 from the light-emitting surface. The opposite side from the light-emitting surface herein refers to the rear side of the display panel 70 or the interior of the display panel 70.

For example, in the case where the photodetector is attached to the rear side of the display panel 70, because a driver for driving the display panel 70 and like modules are generally present on the rear side of the display panel 70, the provision of the photodetector thereon does not increase the thickness of the panel module. The panel module herein means the entire display panel 70 including a driver for driving the display panel 70 and other modules.

Further, in this embodiment, a mirror sheet or like reflection film for reflecting light emitted from the dummy pixel is provided on the light-emitting-surface side of the display panel 70. Accordingly, light emitted from the dummy pixel can be reflected from the reflection film to enter the photodetector provided on the rear side of the display panel 70. Therefore, even when the photodetector is provided on, for example, the rear side of the display panel 70, the luminance of the dummy pixel can be reliably and efficiently detected.

[2-1. Burn-in Correction Circuit]

Figure 9:
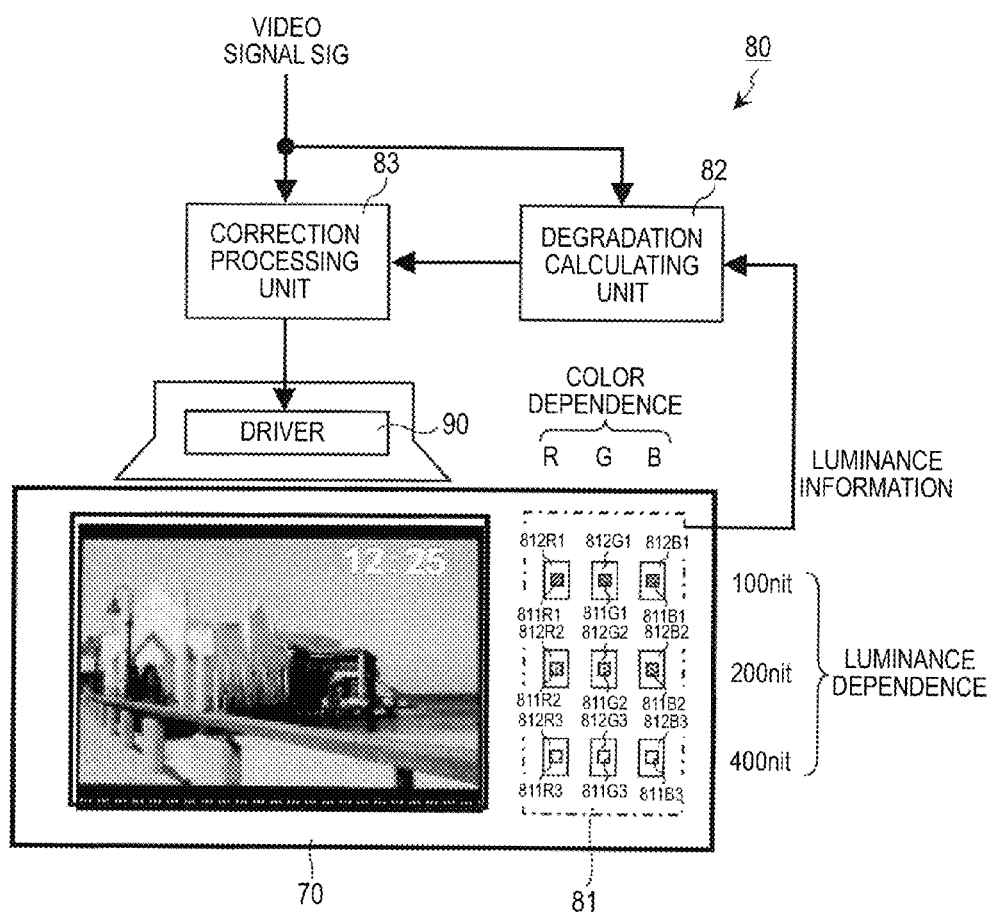
FIG. 9 is a block diagram showing the configuration of a burn-in correction circuit that realizes the burn-in correction function according to an embodiment of the invention.

FIG. 9 is a block diagram showing the configuration of a burn-in correction circuit that realizes the burn-in correction function according to an embodiment of the invention. Here, the organic EL display device using the burn-in correction circuit according to this application example is a display device for color display, in which the basic emission colors of each pixel (sub pixels) 20 in the pixel array portion 30 are the three primary colors, i.e., R (red), G (green), and B (blue).

As shown in FIG. 9, the burn-in correction circuit 80 of this application example includes a dummy pixel portion 81, a degradation calculating unit 82, and the correction processing unit 83. On the display panel 70, the dummy pixel portion 81 is provided outside the pixel array portion (display area) 30. The dummy pixel portion 81 includes three-color dummy pixels 811R, 811G, and 811B corresponding to the R, G, and B of the pixels 20 forming the pixel array portion 30. That is, the dummy pixels 811R, 811G, and 811B have color dependence corresponding to the basic emission colors of the display area.

Further, a plurality of dummy pixels 811R are provided corresponding to several emission luminance levels, and the same applies also to the dummy pixels 811G and 811B; the dummy pixels 811R, 811G, and 811B thus also have luminance dependence. Specifically, the R dummy pixels 811R include three dummy pixels 811R1, 811R2, and 811R3 corresponding to three levels of emission luminance, for example, 100 nit, 200 nit, and 400 nit. Similarly, the G dummy pixels 811G include three dummy pixels 811G1, 811G2, and 811G3 corresponding to three levels of emission luminance, and the B dummy pixels 811B include three dummy pixels 811B1, 811B2, and 811B3 corresponding to three levels of emission luminance.

The R dummy pixels 811R1, 811R2, and 811R3, the G dummy pixels 811G1, 811G2, and 811G3, and the B dummy pixels 811B1, 811B2, and 811B3 are driven by display signals for dummy pixels corresponding to respective colors and respective emission luminance levels, thereby emitting light. Hereinafter, these dummy pixels of several emission colors at several emission luminance levels are sometimes collectively referred to as dummy pixels 811.

In addition to the dummy pixels 811, the dummy pixel portion 81 also includes photodetectors 812 (812R1, 812R2, 812R3/812G1, 812G2, 812G3/812B1, 812B2, 812B3). The photodetectors 812 detect light emitted from the dummy pixels 811 of several emission colors at several emission luminance levels, thereby measuring the luminance of respective dummy pixels 811.

Known photodetection devices can be used as the photodetectors 812. An example thereof is a visible light sensor including an amorphous silicon semiconductor. Each photodetector 812 outputs the luminance information (information about the amount of light), which is detected as a current value, as a voltage value, for example. The luminance information that is the result of detection by the photodetector 812 is supplied to the degradation calculating unit 82.

Figure 10A:
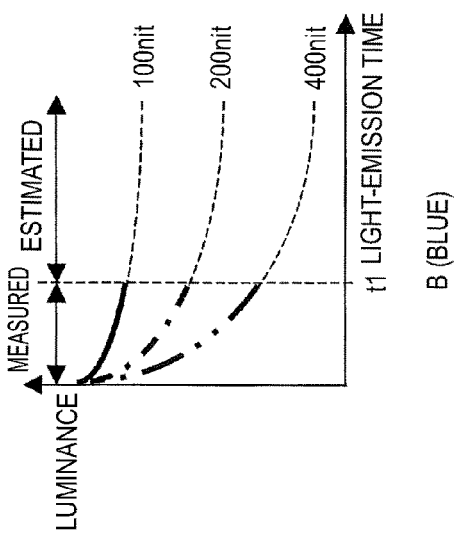
FIGS. 10A to 10C show the light-emission time versus luminance characteristics of the emission colors RGB at luminance levels of 100 nit, 200 nit, and 400 nit.
Figure 10B:
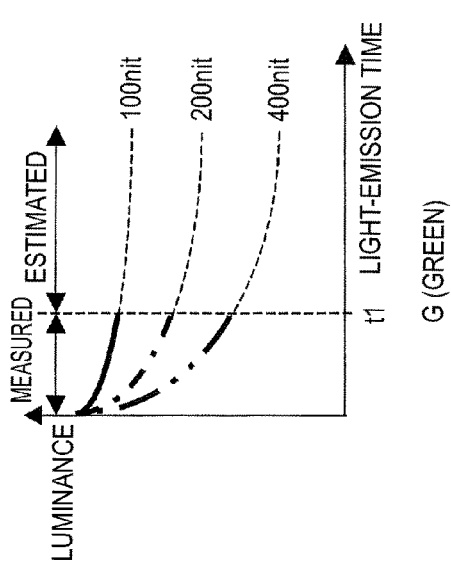
Figure 10C:
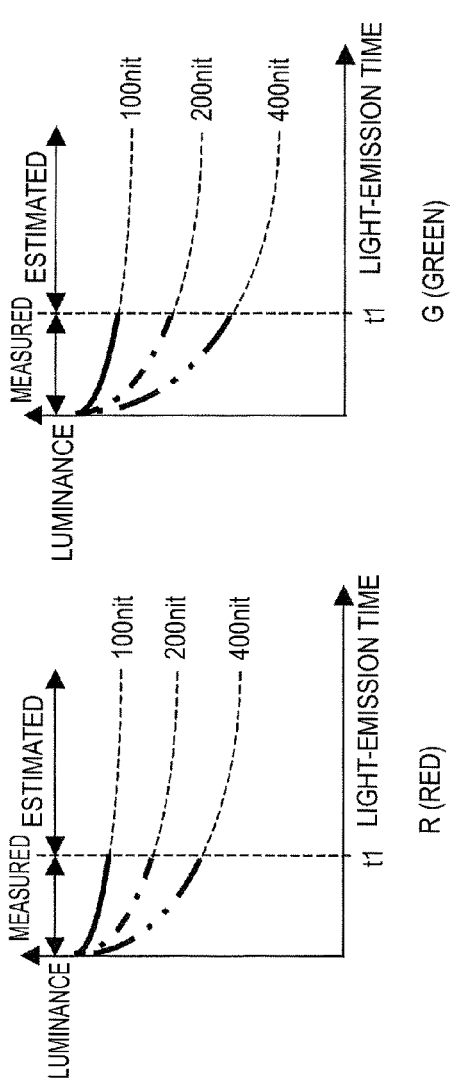

As mentioned above, the organic EL device that serves as a light-emitting device in a dummy pixel 811 loses its luminance efficiency in proportion to the emission luminance (light-emission amount) and the light-emission time. The degree of the decrease in luminance efficiency differs from one emission color to another. FIGS. 10A to 10C show the light-emission time versus luminance characteristics of the emission colors RGB at luminance levels of 100 nit, 200 nit, and 400 nit. In FIGS. 10A to 10C, the data before the light-emission time t1 shows measured characteristics, while the date after the time t1 shows estimated characteristics.

In such a dummy pixel portion 81 formed of a combination of the dummy pixels 811 and the photodetectors 812, the feature of this embodiment lies in the layout of the photodetectors 812 relative to the dummy pixels 811. Specific embodiments thereof will be described later.

The degradation calculating unit 82 determines the luminance degradation characteristics of each emission color based on the detection results (luminance information) from the photodetectors 812 corresponding to the dummy pixels 811 of several emission colors at several emission luminance levels, and, using the obtained degradation characteristic curves and video signals, calculates the amount of degradation of the effective pixels 20 in the area where burn-in will occur. The amount of degradation of the effective pixels 20 herein means the amount of degradation of light-emitting devices of the effective pixels 20, i.e., organic EL devices. In addition, the degradation characteristic curves determined by the degradation calculating unit 82 are equivalent to the degradation characteristic curves shown in FIGS. 10A to 10C.

The correction processing unit 83 is formed of an FPGA (Field Programmable Gate Array), etc. The correction processing unit 83 calculates the amount of burn-in correction based on the amount of degradation of the organic EL devices calculated by the degradation calculating unit 82. In accordance with the calculated burn-in correction amount, the correction processing unit 83 controls the levels of video signals SIG for driving the effective pixels 20 in the area where burn-in will occur, thereby correcting the emission luminance of such effective pixels 20. As a result of this luminance correction, burn-in due to the property degradation of the organic EL devices, light-emitting devices, can be corrected from a signal processing perspective.

The video signals corrected by the correction processing unit 83 are supplied to a driver 90 for driving the effective pixels 20 on the display panel 70 to perform image display. The driver 90 and other modules are located on the rear side of the display panel 70. The driver 90 supplies the signal voltages Vsig of the video signals to the signal output circuit (selector) 60 shown in FIG. 2.

As mentioned above, the burn-in correction circuit 80 of this application example for correcting burn-in due to the property degradation of organic EL devices from a signal processing perspective is configured to take the following path: dummy pixels 811→photodetectors 812→degradation calculating unit 82→correction processing unit 83→driver 90. The circuit that realizes the burn-in correction function is not limited to such a burn-in correction circuit 80. So long as burn-in can be corrected from a signal processing perspective, any configuration is possible.

With respect to the layout of the photodetectors 812 relative to the dummy pixels 811, which characterizes the embodiment, specific examples thereof will be given hereinafter.

[2-2. Example 1]

FIG. 11 is a cross section showing the configuration of a dummy pixel 811 including a photodetector 812 according to Example 1. As mentioned above, like the pixel (effective pixel) 20 shown in FIG. 2, the dummy pixel 811 includes an organic EL device 21, and also has a drive circuit including a drive transistor 22 and the like.

As shown in FIG. 11, the drive circuit including the drive transistor 22 and the like is formed on a transparent substrate, for example, a glass substrate, 701. Among the components of the drive circuit, only the drive transistor 22 is illustrated in the figure, omitting other components.

The drive transistor 22 includes a gate electrode 221, source/drain regions 223 and 224 on the opposite sides of a polysilicon semiconductor layer 222, and a channel-forming region 225 in a portion of the polysilicon semiconductor layer 222 facing the gate electrode 221. Source/drain electrodes 226 and 227 are electrically connected to the source/drain regions 223 and 224, respectively.

An organic EL device 21 is further formed on the glass substrate 701 with an insulating film 702 and an insulating planarization film 703 therebetween. The organic EL device 21 is a light-emitting device of the dummy pixel 811. The organic EL device 21 includes an anode electrode 211, an organic layer 212, and a cathode electrode 213. The anode electrode 211 is made of metal, for example. The cathode electrode 213 is formed of, for example, a transparent conductive film that is located on the organic layer 212 and is common to all the pixels.

In the organic EL device 21, the organic layer 212 is formed by stacking a hole transport layer/a hole injection layer, a light-emitting layer, an electron transport layer, and an electron injection layer sequentially on the anode electrode 211. Under current drive by the drive transistor 22, current flows into the organic layer 212 via the anode electrode 211, whereby electrons and holes recombine in the light-emitting layer in the organic layer 212, causing light emission.

Then, after the organic EL device 21 for each pixel is formed on the glass substrate 701 with the insulating film 702 therebetween, a glass substrate 705 or like transparent substrate is attached thereto with a passivation film 704 therebetween. The organic EL device 21 is sealed with the glass substrate 705 to give a display panel 70. The dummy pixel 811 is formed at the same time and in the same process as the effective pixels 20 in the pixel array portion 30.

In each dummy pixel 811 thus configured, the photodetector 812 for detecting the luminance of the organic EL device 21 is provided on the rear side of the display panel 70 (the opposite side from the light-emitting surface), i.e., the bottom side of the glass substrate 701. Such a photodetector 812 occupies an area larger than the pixel area of one pixel, and is, for example, attached to the glass substrate 701 in such a manner that the side thereof facing the organic EL device 21 serves as its light-receiving surface.

Meanwhile, in a portion of the display panel 70 where the dummy pixel portion 81 is formed, a reflection film 813, such as a mirror sheet, is formed on the glass substrate 705 located on the light-emitting-surface side of the display panel 70. The reflection film 813 is formed of an aluminum film or of a sheet of metal obtained by metal deposition or the like, and is laminated on the light-emitting surface of the display panel 70, i.e., on the glass substrate 705.

The reflection film 813 reflects light emitted from the organic EL device 21 to thereby direct the light to the photodetector 812 provided on the rear side of the display panel 70. The light emitted from the organic EL device 21 is reflected not only from the reflection film 813 but also from the interface of the glass substrate 705 (joint between the glass substrate 705 and the passivation film 704) to enter the photodetector 812.

Incidentally, as mentioned above, the dummy pixel 811 is formed at the same time and in the same process as the effective pixels 20 in the pixel array portion 30. Therefore, when forming a plurality of dummy pixels 811, such dummy pixels 811 are generally formed to have the same pixel pitch as the effective pixels 20 in the pixel array portion 30.

However, the layout of this Example 1 is configured so that there are no obstacles in the optical path of light reflected from the reflection film 813 and the interface of the glass substrate 705 to the photodetector 812.

Specifically, first, in order to provide a cathode potential Vcath to each of the effective pixels 20 in the pixel array portion 30, as shown in FIG. 12, auxiliary wires 706 around the pixel array portion 30 are placed to avoid the portion where the dummy pixel portion 81 is formed. The auxiliary wires 706 are usually arranged in a mesh among the effective pixels 20 in the pixel array portion 30, thereby reducing the wire resistance of the cathode wire (the common power supply line 34 in FIG. 2).

If the auxiliary wires 706 are provided also in the portion where the dummy pixel portion 81 is formed as in the pixel array portion 30, naturally, as indicated by dashed lines in FIG. 11, the auxiliary wires 706 among the pixels will appear as obstacles to reflected light in the optical path of the reflected light from the reflection film 813 and the like.

However, when the auxiliary wires 706 are placed to avoid the portion where the dummy pixel portion 81 is formed, the optical path of light reflected from the reflection film 813 and the interface of the glass substrate 705 is free from obstruction by the auxiliary wires 706. As a result, the light emitted from the organic EL device 21 and reflected from the reflection film 813 and the like can be efficiently directed to the photodetector 812.

Assume that the pixels in the dummy pixel portion 81 are formed to have the same pixel pitch as in the pixel array portion 30; then, also for the anode electrode 211 or the metal electrodes (the gate electrode 221 and the source/drain electrodes 226 and 227) of the drive transistor 22 in a pixel adjacent to a dummy pixel 811, as indicated by dashed lines in FIG. 11, the auxiliary wires 706 among the pixels appear as obstacles to reflected light in the optical path of the reflected light from the reflection film 813 and the like.

Then, the pixel adjacent to a dummy pixel 811 is configured not to have the anode electrode 211 or the metal electrodes (the gate electrode 221 and the source/drain electrodes 226 and 227) of the drive transistor 22 thereof. As a result, as in the case of the auxiliary wires 706, there are no obstacles in the optical path of light reflected from the reflection film 813 and the interface of the glass substrate 705 to the photodetector 812, and, therefore, the light emitted from the organic EL device 21 and reflected from the reflection film 813 and the like can be efficiently directed to the photodetector 812.

As mentioned above, in the layout of the photodetector 812 of Example 1, the photodetector 812 is provided on the rear side of the display panel 70, while the reflection film 813 for reflecting light emitted from the organic EL device 21 is provided on the front side of the display panel 70. Such a configuration allows the photodetector 812 to be laid out without increasing the panel module thickness. Further, the light emitted from the organic EL device 21 can be directed to the photodetector 812 by reflection from the reflection film 813, and the luminance of the dummy pixel 811 can thus be detected efficiently.

In particular, because there are no obstacles in the optical path of light reflected from the reflection film 813 and the interface of the glass substrate 705 to the photodetector 812, the loss of light entering the photodetector 812 can be suppressed, and the luminance of the dummy pixel 811 can thus be detected more efficiently. In addition, the photodetector 812 can be, for example, attached to the rear side of the display panel 70, and this configuration is thus also advantageous in that a known high-sensitivity photodetection device can be used as the photodetector 812.

[2-3. Example 2]

Figure 13:
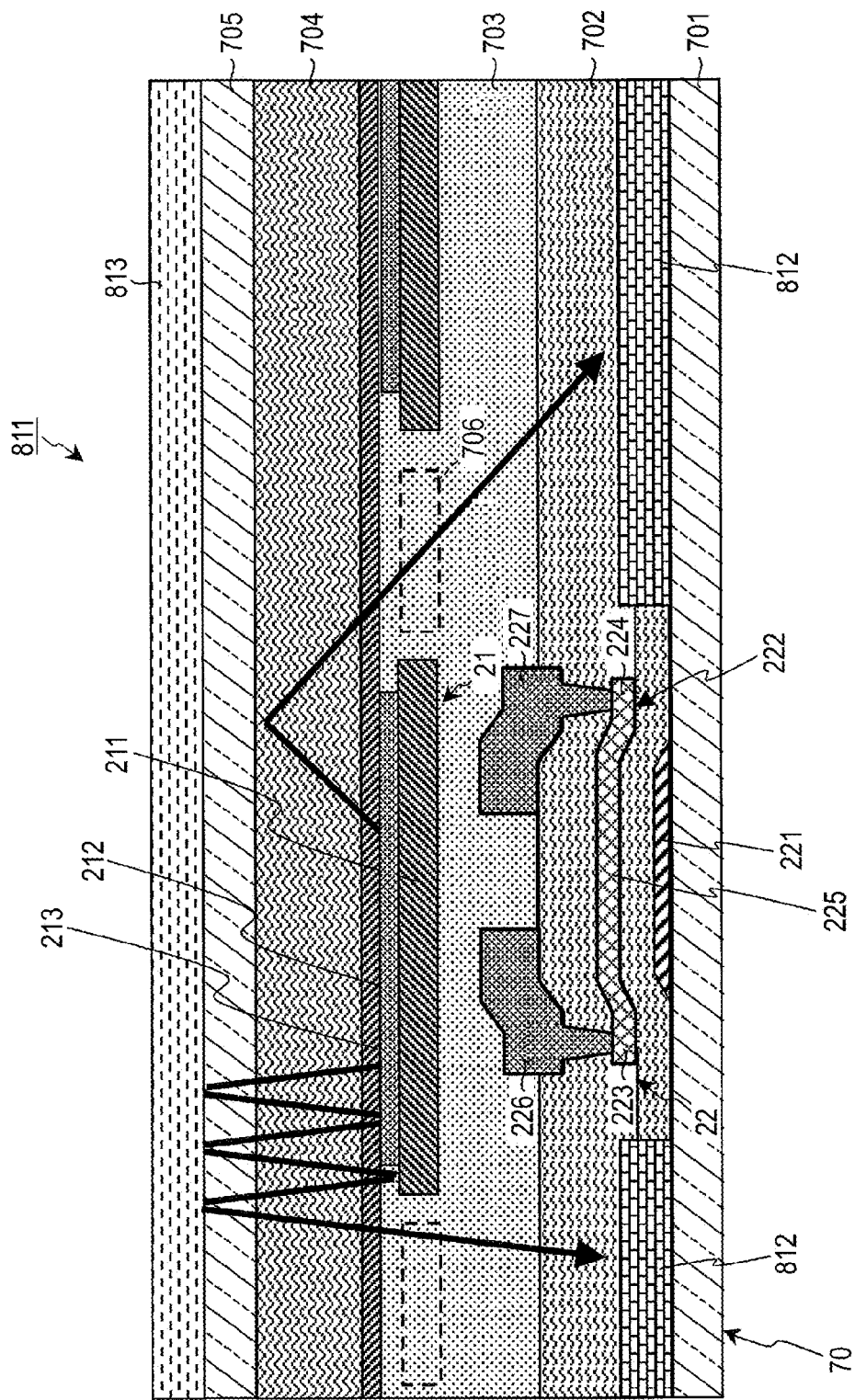
FIG. 13 is a cross section showing the configuration of a dummy pixel including a photodetector according to Example 2.

FIG. 13 is a cross section showing the configuration of a dummy pixel 811 including a photodetector 812 according to Example 2. In FIG. 13, the components common to FIG. 11 (corresponding components) are indicated by the same reference numerals, and will not be further explained to avoid repetitive description.

In the layout of the photodetector 812 of Example 1, the photodetector 812 is provided by attachment on the rear side of the display panel 70, for example. In contrast, in the layout of the photodetector 812 of Example 2, as shown in FIG. 12, the photodetector 812 is provided by incorporation into the display panel 70 (built-in).

That is, in the layout of the photodetector 812 of Example 2, in the process of forming the drive transistor 22 and the like on the glass substrate 701, the photodetector 812 is also formed on the glass substrate 701 in the same manner. A PIN photodiode or the like is usable as such a photodetector 812.

The layout of the photodetector 812 of Example 2 provides the same advantages as Example 1. In addition, in the process of forming the display panel 70, the photodetector 812 can be fabricated therein, providing another advantage in that this saves the step of, after the formation of the display panel 70, attaching the photodetector 812 thereto as in Example 1.

3. Alternative Embodiment

The above embodiments have been described with examples of applications to an organic EL display device having an organic EL device as an electro-optic device (light-emitting device) of a pixel 20. However, these application examples do not limit the invention. That is, the invention is applicable to any light-emitting display device having as an electro-optic device of a pixel 20 a light-emitting device such as an inorganic EL device, an LED device, or a semiconductor laser device.

4. Application Example

The display devices according to the embodiments of the invention explained above are applicable as display devices for use in an electronic apparatus of any field, where video signals supplied to the electronic apparatus or video signals produced in the electronic apparatus are displayed as images or videos. For example, the display devices can be applied for use in the various kinds of electronic apparatuses shown in FIGS. 14, to 18, such as a digital camera, a laptop personal computer, a mobile phone, and like portable terminals, a video camera and like display devices, etc.

Use of a display device according to an embodiment of the invention as a display device in an electronic apparatus of any field allows the electronic apparatus to achieve high-quality image display without an increase in size. That is, as is clear from the above-described embodiments, a display device according to an embodiment of the invention makes it possible to suppress burn-in due to the property degradation of a light-emitting device, without increasing the thickness of the panel module. This thus achieves high-quality image display on a thin panel module.

A display device according to an embodiment of the invention may be in the form of a sealed module. An example thereof is a display module including the pixel array portion 30 and a transparent opposed member made of glass, for example, attached thereto. The transparent opposed member may be provided with a color filter, a protective film, etc., and may further have a shading film. In addition, the display module may be provided with a circuit unit or a FPC (flexible print circuit) for input/output of signals from the outside to the pixel array portion, for example.

With respect to an electronic apparatus to which the invention is applicable, specific examples thereof will be given hereinafter.

Figure 14:
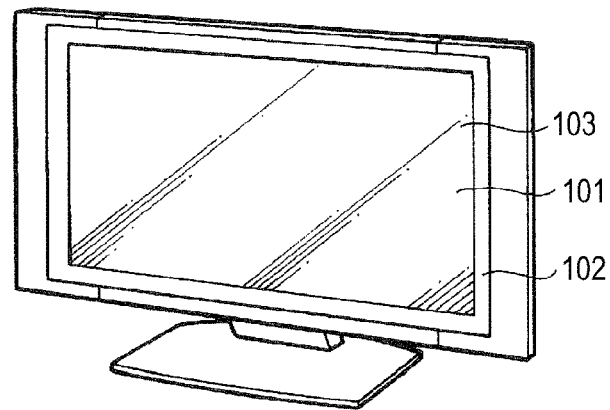
FIG. 14 is a perspective view showing the appearance of a television set according to an embodiment of the invention.

FIG. 14 is a perspective view showing the appearance of a television set according to an embodiment of the invention. The television set of this application example includes a video display screen portion 101 formed of a front panel 102, a filter glass 103, etc., and a display device according to an embodiment of the invention serves as the video display screen portion 101.

Figure 15A:
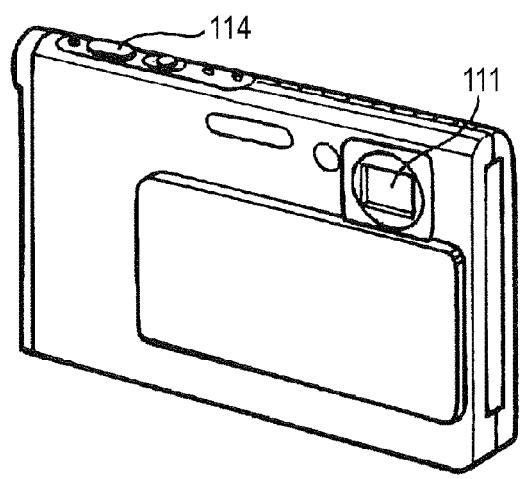
FIGS. 15A and 15B are perspective views showing the appearance of a digital camera according to an embodiment of the invention.
Figure 15B:
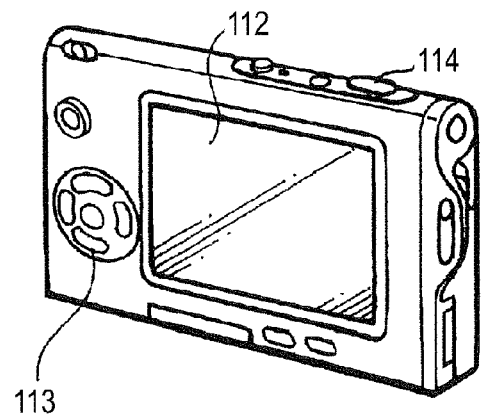

FIGS. 15A and 15B are perspective views showing the appearance of a digital camera according to an embodiment of the invention. FIG. 15A is a perspective view from the front, and FIG. 15B is a perspective view from the back. The digital camera of this application example includes a light-emitting portion 111 to provide a flashlight, a display portion 112, a menu switch 113, a shutter release 114, etc., and a display device according to an embodiment of the invention serves as the display portion 112.

Figure 16:
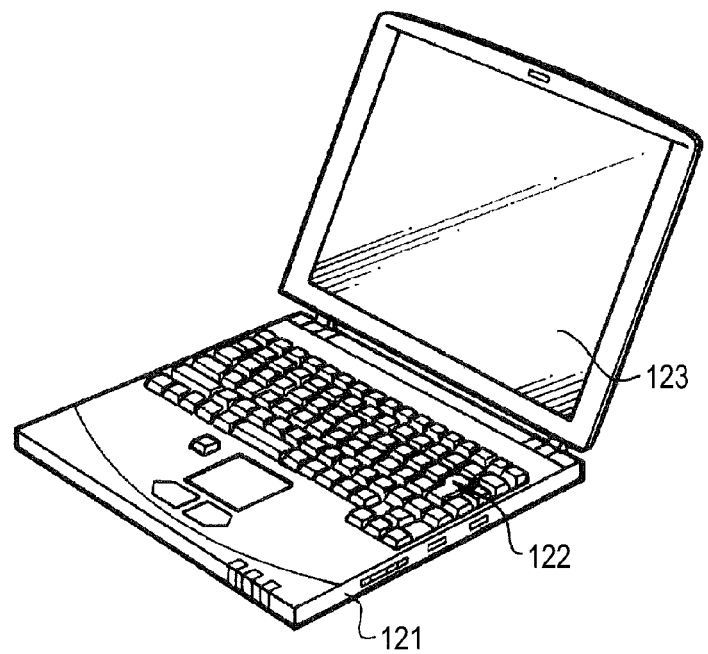
FIG. 16 is a perspective view showing the appearance of a laptop personal computer according to an embodiment of the invention.

FIG. 16 is a perspective view showing the appearance of a laptop personal computer according to an embodiment of the invention. The laptop personal computer of this application example includes a body 121, a keyboard 122 to be operated to enter characters and the like, a display portion 123 for displaying an image, etc., and a display device according to an embodiment of the invention serves as the display portion 123.

Figure 17:
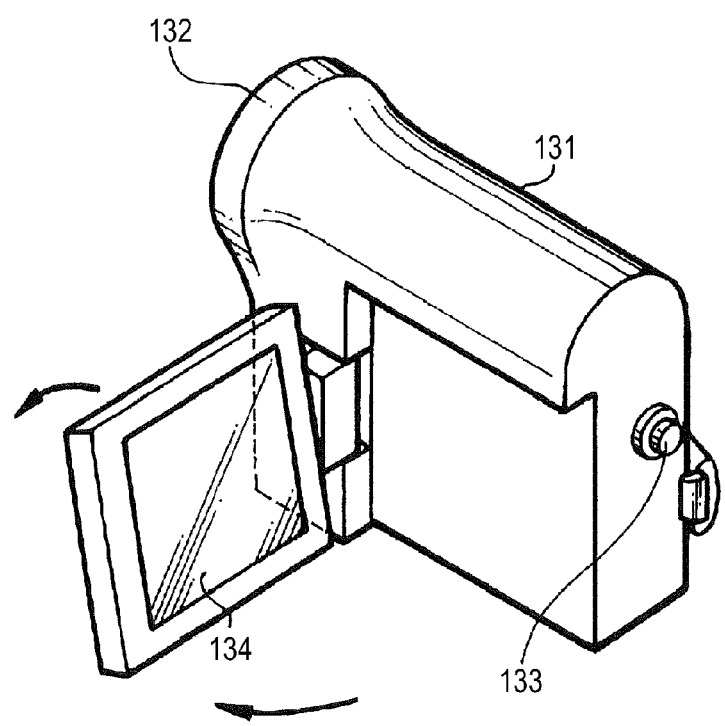
FIG. 17 is a perspective view showing the appearance of a video camera according to an embodiment of the invention.

FIG. 17 is a perspective view showing the appearance of a video camera according to an embodiment of the invention. The video camera of this application example includes a body portion 131, a lens 132 provided on the front-facing side thereof for capturing an image of an object, a start/stop switch 133 for use in image capturing, a display portion 134, etc., and a display device according to an embodiment of the invention serves as the display portion 134.

FIGS. 18A to 18G show the appearance of a portable terminal, for example, a mobile phone, according to an embodiment of the invention. FIG. 18A is a front view of the mobile phone opened, and FIG. 18B is a side view thereof. FIG. 18C is a front view of the mobile phone closed, FIG. 18D is a left side view thereof, FIG. 18E is a right side view thereof, FIG. 18F is a top view thereof, and FIG. 18G is a bottom view thereof. The mobile phone of this application example includes an upper housing 141, a lower housing 142, a connection portion (here, a hinge portion) 143, a display 144, a sub-display 145, a picture light 146, a camera 147, etc. The mobile phone of this application example is produced using display devices according to an embodiment of the invention as the display 144 and the sub-display 145.

The present application contains subject matter related to that disclosed in Japanese Priority Patent Application JP 2009-192853 filed in the Japan Patent Office on Aug. 24, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a dummy pixel on a display panel;
a reflection film on a light-emitting-surface side of the display panel for reflecting light emitted from the dummy pixel;
a transparent substrate on the light-emitting-surface side of the display panel;
a photodetector on a side of the display panel opposite to the light-emitting-surface side for detecting the light emitted from the dummy pixel and reflected from the reflection film; and
a correction circuit for correcting, based on results of detection by the photodetector, luminance of effective pixels that contribute to image display,
wherein,
the light emitted from the dummy pixel is reflected also from an interface of the transparent substrate and enters the photodetector,
the display device further comprises auxiliary wires arranged in a mesh and provided to a pixel array of the effective pixels arranged in a matrix for supplying a cathode potential to the effective pixels, and
the auxiliary wires are located to avoid a region where the dummy pixel is formed.

2. The display device according to claim 1, wherein a component of a pixel adjacent to the dummy pixel is located to avoid an optical path of the light reflected from the reflection film and the interface of the transparent substrate to the photodetector.

3. The display device according to claim 2, wherein the component of the pixel adjacent to the dummy pixel is an anode electrode of an electro-optic device of the pixel.

4. The display device according to claim 2, wherein
the component of the pixel adjacent to the dummy pixel is a metal electrode of a transistor included in the pixel.

5. The display device according to claim 1, wherein:
the display device further comprises a driver module on a rear side of the display panel for driving a pixel on the display panel, and
the photodetector is on the rear side of the display panel.

6. The display device according to claim 1, wherein the photodetector is incorporated into the display panel.

7. An electronic apparatus comprising:
a display device including
a dummy pixel on a display panel,
a reflection film on a light-emitting-surface side of the display panel for reflecting light emitted from the dummy pixel,
a transparent substrate on the light-emitting-surface side of the display panel,
a photodetector on a side of the display panel opposite to the light-emitting-surface side for detecting the light emitted from the dummy pixel and reflected from the reflection film, and
a correction circuit for correcting, based on results of detection by the photodetector, luminance of effective pixels that contribute to image display,
wherein,
the light emitted from the dummy pixel is reflected also from an interface of the transparent substrate and enters the photodetector,
the display device further comprises auxiliary wires arranged in a mesh and provided to a pixel array of the effective pixels arranged in a matrix for supplying a cathode potential to the effective pixels, and
the auxiliary wires are located to avoid a region where the dummy pixel is formed.

8. An electronic apparatus comprising:
a dummy pixel on a display panel;
a reflection film on a light-emitting-surface side of the display panel;
a transparent substrate on the light-emitting-surface side of the display panel;
a photodetector on a side of the display panel opposite to the light-emitting-surface side for detecting the light emitted from the dummy pixel and reflected from the reflection film; and
a driver module on the side of the display panel opposite to the light-emitting-surface side for driving a pixel on the display panel, wherein,
the light emitted from the dummy pixel is reflected also from an interface of the transparent substrate and enters the photodetector,
the display device further comprises auxiliary wires arranged in a mesh and provided to a pixel array of the effective pixels arranged in a matrix for supplying a cathode potential to the effective pixels, and
the auxiliary wires are located to avoid a region where the dummy pixel is formed.

9. The display device according to claim 1, wherein:
the display device further comprises a passivation film,
the transparent substrate is between the passivation film and the reflection film, and
the interface of the transparent substrate corresponds to a joint between the transparent substrate and the passivation film.

10. The electronic apparatus according to claim 7, wherein:
the display device further comprises a passivation film,
the transparent substrate is between the passivation film and the reflection film, and
the interface of the transparent substrate corresponds to a joint between the transparent substrate and the passivation film.

11. The electronic apparatus according to claim 8, wherein:
the electronic apparatus further comprises a passivation film,
the transparent substrate is between the passivation film and the reflection film, and
the interface of the transparent substrate corresponds to a joint between the transparent substrate and the passivation film.

12. The display device according to claim 5, wherein the photodetector is attached to the rear side of the display panel.

* * * * *